US011611047B2

(12) United States Patent
Ke et al.

(10) Patent No.: US 11,611,047 B2
(45) Date of Patent: Mar. 21, 2023

(54) THERMALLY ACTIVATED DELAYED FLUORESCENT MATERIAL AND APPLICATION THEREOF

(71) Applicant: Wuhan Tianma Micro-Electronics Co., Ltd., Wuhan (CN)

(72) Inventors: Xin Ke, Wuhan (CN); Kui Wang, Wuhan (CN)

(73) Assignee: Wuhan Tianma Micro-Electronics Co., Ltd., Wuhan (CN)

(*) Notice: Subject to any disclaimer, the term of this patent is extended or adjusted under 35 U.S.C. 154(b) by 316 days.

(21) Appl. No.: 15/931,293

(22) Filed: May 13, 2020

(65) Prior Publication Data
US 2020/0411768 A1 Dec. 31, 2020

(30) Foreign Application Priority Data

Jun. 29, 2019 (CN) .......................... 201910580869.0

(51) Int. Cl.
*H01L 51/00* (2006.01)
*C07F 5/02* (2006.01)
(Continued)

(52) U.S. Cl.
CPC .......... *H01L 51/0072* (2013.01); *C07F 5/027* (2013.01); *C09K 11/06* (2013.01); *H01L 51/0059* (2013.01); *H01L 51/0071* (2013.01); *H01L 51/0073* (2013.01); *C09K 2211/1007* (2013.01); *C09K 2211/1018* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01)

(58) Field of Classification Search
CPC ............. H01L 51/0072; H01L 51/0059; H01L 51/0071; H01L 51/0073; H01L 51/5016;
(Continued)

(56) References Cited

U.S. PATENT DOCUMENTS

2019/0013478 A1* 1/2019 Iijima ................. H01L 51/0071

FOREIGN PATENT DOCUMENTS

| CN | 108530474 A | * | 9/2018 | .............. C07F 5/022 |
| CN | 108586441 A | | 9/2018 | |

(Continued)

OTHER PUBLICATIONS

Chinese Office Action related to Application No. 201910580869.0; dated Apr. 1, 2021.
(Continued)

*Primary Examiner* — Mamadou L Diallo
(74) *Attorney, Agent, or Firm* — von Briesen & Roper, s.c.

(57) ABSTRACT

The present disclosure provides a thermally activated delayed fluorescent material and application thereof, the thermally activated delayed fluorescent material is a compound having a structure represented by Formula I and can be used as a light-emitting layer material of an organic electroluminescent device. The thermally activated delayed fluorescent material is applied to an organic electroluminescent device comprising an anode, a cathode, and at least one organic thin film layer between the anode and the cathode, the light-emitting layer in the organic thin film layer comprises any one or a combination of at least two of the thermally activated delayed fluorescent materials. An energy level difference between the triplet state and the singlet state of the thermally activated delayed fluorescent material provided by the present disclosure can be reduced to below 0.25 eV, and when used as a light-emitting layer material in an organic electroluminescent device, it can improve carrier balance, increase luminous efficiency, and reduce the device's voltage.

10 Claims, 1 Drawing Sheet

(51) Int. Cl.
*C09K 11/06* (2006.01)
*H01L 51/50* (2006.01)

(58) Field of Classification Search
CPC ............ H01L 51/5056; H01L 51/5072; H01L 51/5088; H01L 51/5092; H01L 51/5096; H01L 51/5012; H01L 51/0052; H01L 51/0054; H01L 51/0056; H01L 51/0074; H01L 51/5024; C07F 5/027; C09K 11/06; C09K 2211/1007; C09K 2211/1018
See application file for complete search history.

(56) References Cited

FOREIGN PATENT DOCUMENTS

| CN | 109134519 A | * | 1/2019 | ............ C07F 5/027 |
| CN | 110183475 A | * | 8/2019 | ............ C07F 5/025 |
| CN | 111377956 A | * | 7/2020 | |
| WO | WO-2018103744 A1 | * | 6/2018 | ............ C09K 11/06 |

OTHER PUBLICATIONS

Lauren G. Mercier, et al., "Benzo[b]thiophene-Fused Boron and Silicon Ladder Acenes", Organometallics, American Chemical Society, Jul. 3, 2013.

* cited by examiner

THERMALLY ACTIVATED DELAYED FLUORESCENT MATERIAL AND APPLICATION THEREOF

CROSS-REFERENCE TO RELATED APPLICATIONS

The application claims the benefit of the earlier filing date of Chinese Patent Application No. 201910580869.0, filed on Jun. 29, 2019 to the China National Intellectual Property Administration, the contents of which are incorporated by reference herein in its entirety.

TECHNICAL FIELD

The present disclosure belongs to the technical field of organic electroluminescent materials, and in particular relates to a thermally activated delayed fluorescent material and application thereof.

BACKGROUND

Organic electroluminescence is an emerging technology with broad practical prospects in the field of optoelectronic devices at present. Since the rise of Organic Light Emitting Diode (OLED) in 1987, it has received extensive attention and active involvement of researchers. With respect to inorganic electroluminescent devices, organic electroluminescent devices have advantages such as high brightness, high efficiency, low driving pressure, and wide viewing angle, and the like, and can be used to prepare large-area flexible and bendable devices. However, compared with display products widely used in the market, there are still many problems in the display of OLEDs, and one of the key reasons is a lack of materials with excellent performance.

Materials used for an OLED luminescent layer can be classified into the following four types according to their luminous mechanisms: phosphorescent materials, fluorescent materials, triplet-triplet annihilation (TTA) materials, and thermally activated delayed fluorescent (TADF) materials. In the phosphorescent material, the triplet excited state $T_1$ attenuates to the ground state $S_0$ through direct radiation. Due to heavy atom effect, an intramolecular intersystem crossing can be enhanced by spin coupling, and 75% of the triplet excitons can be directly utilized, thereby realizing a $S_1$ and $T_1$ co-participated emission at room temperature, and a theoretical maximum internal quantum yield can reach 100%; according to the Lambert luminescence mode, a light extraction efficiency is about 20%, thus an external quantum efficiency EQE of an OLED device based on the phosphorescent material can reach 20%. However, the phosphorescent materials are mostly complexes of heavy metals such as Ir, Pt, Os, Re, Ru, etc., which have high production cost and which are not conducive to large-scale industrial production; and at high current density, phosphorescent materials have serious efficiency roll-off phenomenon, therefore a phosphorescent device has poor stability. In the fluorescent material, the singlet excited state $S_1$ returns to the ground state $S_0$ through a radiative transition. According to a spin statistics, a ratio of singlet and triplet excitons in excitons is 1:3, thus a maximum internal quantum yield of the fluorescent material is less than 25%. According to the Lambert luminescence mode, a light extraction efficiency is about 20%, therefore an EQE of an OLED device based on the fluorescent material does not exceed 5%, and the OLED device based on the fluorescent material has poor luminescence properties. Two of triplet excitons of the TTA material interact and recombine to form a molecule in a singlet excited state with a higher energy level and a molecule in a ground state; but two triplet excitons produce one singlet exciton, therefore a theoretical maximum internal quantum yield can only reach 62.5%; in order to prevent a large efficiency roll-off phenomenon, it is necessary to regulate a concentration of triplet excitons in such process, resulting in high preparation cost of the TTA material.

In the TADF material, when an energy gap value of the $S_1$ state and the $T_1$ state is small and excitons in the $T_1$ state have long lifetime, a reverse intersystem crossing (RISC) occurs inside a molecule, and excitons in the $T_1$ state convert to the $S_1$ state by absorbing an ambient heat, and then radiation attenuate from the $S_1$ state to the ground state $S_0$. Therefore, the TADF material can simultaneously utilize 75% of triplet excitons and 25% of singlet excitons, and a theoretical maximum internal quantum yield can reach 100%. Moreover, TADF materials are mainly organic compounds, do not require rare metal elements, have low production costs, and can be chemically modified by various methods to achieve an optimization of performance.

CN106966954A, CN109651242A, CN108586441A, etc. disclose TADF materials and organic optoelectric devices comprising the same, but few TADF materials have been found up to now, and their luminescence properties cannot meet people's requirements for OLED devices as well.

Therefore, a development of more kinds of novel TADF materials with high luminescence properties is an urgent problem to be solved in the art.

SUMMARY

In order to develop more kinds of TADF materials with higher luminescence properties, one object of the present disclosure is to provide a thermally activated delayed fluorescent material which is a compound comprising a structure represented by Formula I:

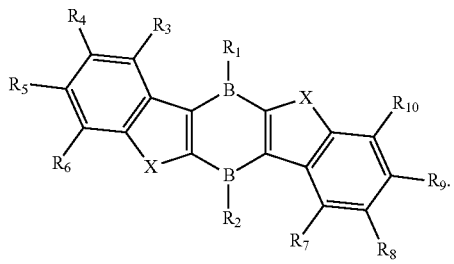

Formula I

In Formula I, $R_1$ and $R_2$ each is independently selected from any one of a group consisting of a substituted or unsubstituted C6-C60 aryl group and a substituted or unsubstituted C3-C60 heteroaryl group.

In Formula I, X is selected from any one of a group consisting of O, S and N—$R_x$, and $R_x$ is selected from any one of a group consisting of hydrogen, fluorine, chlorine, a substituted or unsubstituted C1-C30 alkyl group, a substituted or unsubstituted C3-C30 cycloalkyl group, a substituted or an unsubstituted C3-C20 heterocycloalkyl group, a substituted or unsubstituted C6-C60 aryl group, and a substituted or unsubstituted C3-C60 heteroaryl group.

In Formula I, $R_3$-$R_{10}$ each is independently selected from any one of a group consisting of hydrogen, fluorine, chlorine, a substituted or unsubstituted C1-C30 alkyl group, a substituted or unsubstituted C3-C30 cycloalkyl group, a substituted or unsubstituted C3-C20 heterocycloalkyl group, a substituted or unsubstituted C6-C60 aryl group, and a substituted or unsubstituted C3-C60 heteroaryl group; wherein $R_3$-$R_{10}$ are not linked to each other or at least two of them adjacent to each other are linked to form a ring or fused with each other.

C6-C60 can be C7, C9, C10, C13, C15, C18, C20, C23, C25, C28, C30, C33, C35, C38, C40, C43, C45, C50, C55 or C58, etc.

C3-C60 can be C4, C5, C6, C8, C10, C13, C15, C18, C20, C23, C25, C28, C30, C33, C35, C38, C40, C43, C45, C50, C55 or C58, etc.

C3-C30 can be C4, C5, C6, C8, C10, C13, C15, C18, C20, C23, C25, C28 or C29, etc.

C3-C20 can be C4, C5, C6, C8, C10, C13, C15, C18 or C19, etc.

C1-C30 can be C2, C4, C6, C8, C10, C13, C15, C17, C20, C22, C25, C28 or C29, etc.

The second object of the present disclosure is to provide a display panel comprising an OLED device, the OLED device comprising an anode, a cathode, and at least one organic thin film layer between the anode and the cathode, the organic thin film layer comprising a light-emitting layer, and any one or a combination of at least two of a hole transport layer, a hole injection layer, an electron blocking layer, a hole blocking layer, an electron transport layer, and an electron injection layer.

The light-emitting layer comprises the thermally activated delayed fluorescent material as described above, and the thermally activated delayed fluorescent material is used as any one of a guest material, a host material and a co-doped material.

The third object of the present disclosure is to provide an electronic device comprising the display panel as described above.

Compared with the related technics, the present disclosure has the following beneficial effects:

The thermally activated delayed fluorescent material provided by the present disclosure is a novel organic small molecule luminescent material with a double boron heterocycle, which avoids direct accumulation of intermolecular conjugate planes to form π aggregation or excimer by inserting a large sterically hindered group into the molecular structure, thereby improving luminous efficiency by avoiding aggregation of compound molecules. The molecular structure of the thermally activated delayed fluorescent material has large rigid distortion, which reduces overlap between HOMO and LUMO, so that an energy level difference between the triplet state and the singlet state can be reduced to below 0.25 eV, or even lower than 0.15 eV, which satisfies reverse crossing of energy from the triplet state to the singlet state, thereby achieving high luminous efficiency. The thermally activated delayed fluorescent material of the present disclosure is used as a light-emitting layer material of an organic electroluminescent device, which can improve transport capability of two carriers, improve the carrier's balance, increase fluorescence quantum efficiency, and reduce voltage of the device.

DETAILED DESCRIPTION

Figure 1:
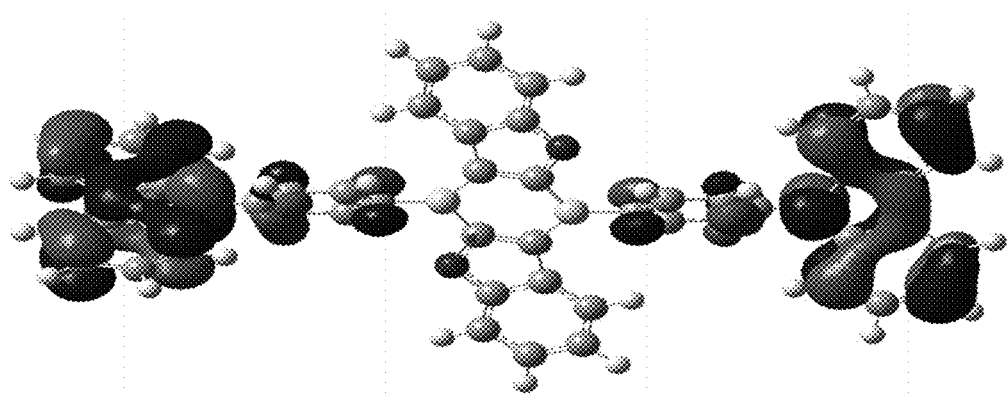
FIG. 1 is a HOMO orbital layout diagram of the thermally activated delayed fluorescent material M1 provided in Example 1 of the present disclosure.

The technical solutions of the present disclosure will be further described below by way of specific embodiments. It will be apparent to those skilled in the art that the embodiments are merely illustrations of the present disclosure and should not be construed as specific limitations to the present disclosure.

One object of the present disclosure is to provide a thermally activated delayed fluorescent material which is a compound comprising a structure represented by Formula I:

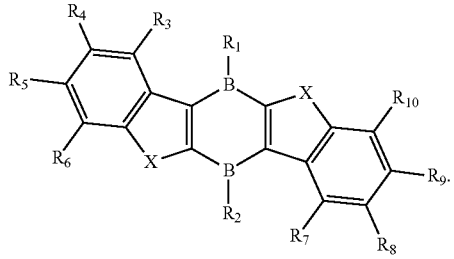

Formula I

In Formula I, $R_1$ and $R_2$ each is independently selected from any one of a group consisting of a substituted or unsubstituted C6-C60 aryl group and a substituted or unsubstituted C3-C60 heteroaryl group.

In Formula I, X is selected from any one of a group consisting of O, S and N—$R_x$, and $R_x$ is selected from any one of a group consisting of hydrogen, fluorine, chlorine, a substituted or unsubstituted C1-C30 alkyl group, a substituted or unsubstituted C3-C30 cycloalkyl group, a substituted or an unsubstituted C3-C20 heterocycloalkyl group, a substituted or unsubstituted C6-C60 aryl group, and a substituted or unsubstituted C3-C60 heteroaryl group.

In Formula I, $R_3$-$R_{10}$ each is independently selected from any one of a group consisting of hydrogen, fluorine, chlorine, a substituted or unsubstituted C1-C30 alkyl group, a substituted or unsubstituted C3-C30 cycloalkyl group, a substituted or unsubstituted C3-C20 heterocycloalkyl group, a substituted or unsubstituted C6-C60 aryl group, and a substituted or unsubstituted C3-C60 heteroaryl group; wherein $R_3$-$R_{10}$ are not linked to each other or at least two of them adjacent to each other are linked to form a ring or fused with each other.

The thermally activated delayed fluorescent material provided by the present disclosure has a double boron heterocyclic parent structure, which effectively avoids direct accumulation of conjugate planes to form π aggregation or excimer by being designed to link sterically hindered substituents $R_1$ and $R_2$ on the two boron atoms respectively. Moreover, the structure represented by Formula I has large rigid distortion, which can reduce overlap between HOMO and LUMO, so that an energy level difference between the triplet state and the singlet state can be reduced to below 0.25 eV, which satisfies reverse crossing of energy from the triplet state to the singlet state, thereby improving the luminous efficiency when it is used as a light-emitting layer material of an organic electroluminescent device. The thermally activated delayed fluorescent material itself has bipolar characteristics and can transport electrons and holes.

Therefore, when it is used as a light-emitting layer material of an organic electroluminescent device, it can greatly improve transport capability of two carriers, improve the carrier's balance, increase fluorescence quantum efficiency, and reduce voltage of the device.

C6-C60 can be C7, C9, C10, C13, C15, C18, C20, C23, C25, C28, C30, C33, C35, C38, C40, C43, C45, C50, C55 or C58, etc.

C3-C60 can be C4, C5, C6, C8, C10, C13, C15, C18, C20, C23, C25, C28, C30, C33, C35, C38, C40, C43, C45, C50, C55 or C58, etc.

C3-C30 can be C4, C5, C6, C8, C10, C13, C15, C18, C20, C23, C25, C28 or C29, etc.

C3-C20 can be C4, C5, C6, C8, C10, C13, C15, C18 or C19, etc.

C1-C30 can be C2, C4, C6, C8, C10, C13, C15, C17, C20, C22, C25, C28 or C29, etc.

The phrase "at least two of them adjacent to each other are linked to form a ring or fused with each other" means substituents among $R_3$-$R_{10}$ which located at adjacent positions in the same six-membered ring, such as $R_3$ and $R_4$, $R_4$ and $R_5$, $R_5$ and $R_6$, $R_7$ and $R_8$, $R_9$ and $R_9$, and $R_9$ and $R_{10}$ may be linked to each other to form a ring by a chemical bond. Specific ring-forming methods are not limited in the present disclosure; and when substituents among $R_3$-$R_{10}$ which located at adjacent positions in the same six-membered ring are aryl groups or heteroaryl groups, two or three adjacent substituents may be fused to each other, and specific fused modes are not limited in the present disclosure. When the same phrase of "at least two of them adjacent to each other are linked to form a ring or fused with each other" is described hereafter, it has the same meaning as defined above.

In one embodiment, a substituent in the substituted aryl group, substituted heteroaryl group, substituted alkyl group, substituted cycloalkyl group, and substituted heterocycloalkyl group is at least one selected from a group consisting of a C1-C10 (for example, C2, C3, C4, C5, C6, C7, C8 or C9) alkyl group, a C6-C20 (for example, C7, C9, C10. C12, C14, C15, C17 or C19, etc.) aryl group, fluorine, chlorine, a C1-C10 (for example, C2, C3, C4, C5, C6, C7, C8 or C9) alkoxyl group, hydroxyl group, carboxyl group, a C6-C20 (for example, C7, C9, C10, C12, C14, C15, C17 or C19, etc.) arylamino group and a C3-C20 (for example, C4, C6, C7, C9, C10, C12, C14, C15, C17 or C19, etc.) cycloalkyl group.

In one embodiment, the thermally activated delayed fluorescent material is a compound comprising a structure represented by Formula II:

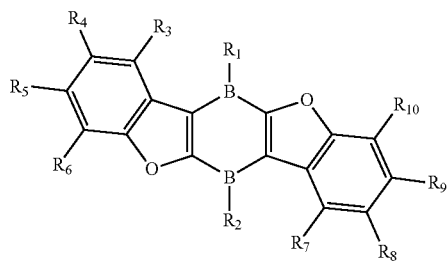

Formula II

In Formula II, $R_1$-$R_{10}$ each independently has the same limited range as described above for $R_1$-$R_{10}$.

In one embodiment, $R_1$ and $R_2$ each is independently selected from any one of a group consisting of a substituted or unsubstituted C6-C24 (for example, C7, C9, C10, C12, C14, C15, C17, C19, C21 or C23, etc.) aryl group and a substituted or unsubstituted C3-C24 (for example, C4, C6, C8, C10, C12, C14, C15, C17, C19, C21 or C23, etc.) heteroaryl group.

When a substituent exists in the above groups, the substituent is selected from at least one of a group consisting of fluorine, chlorine, a C1-C10 (for example, C2, C3, C4, C5, C6, C7, C8 or C9) linear or branched alkyl group, a C6-C20 (for example, C7, C9, C10. C12, C14, C15, C17 or C19, etc.) aryl group, a C1-C10 (for example, C2, C3, C4, C5, C6, C7, C8 or C9) alkoxyl group, a C6-C20 (for example, C7, C9, C10, C12, C14, C15, C17 or C19, etc.) arylamino group and a C3-C20 (for example, C4, C6, C7, C9, C10, C12, C14, C15, C17 or C19, etc.) cycloalkyl group.

In one embodiment, $R_1$ and $R_2$ each is independently selected from any one of a group consisting of the following groups and the following groups substituted by a substituent:

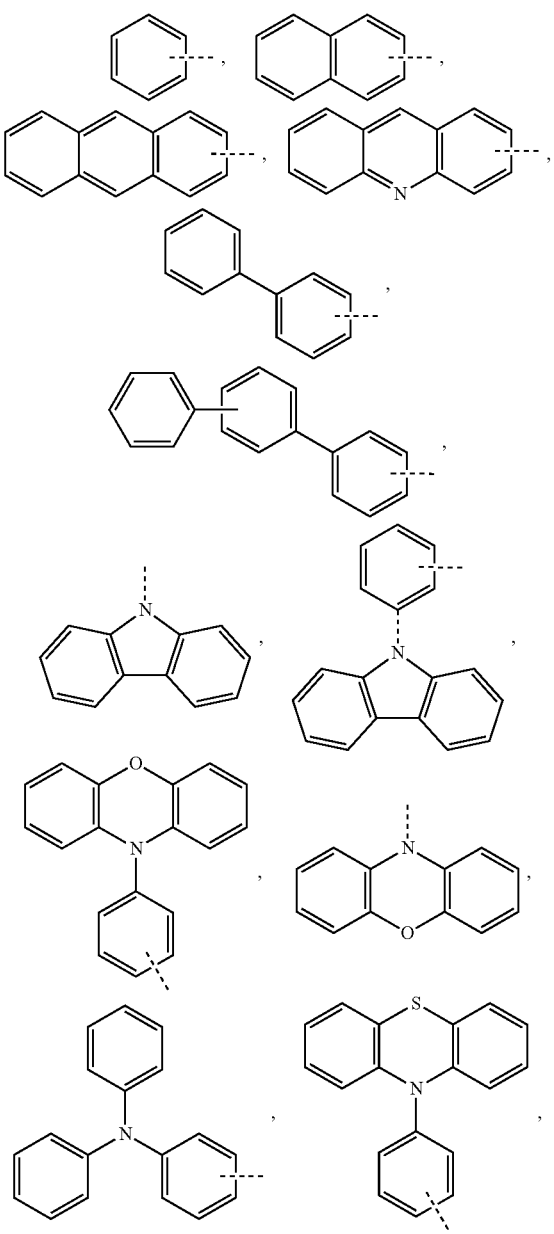

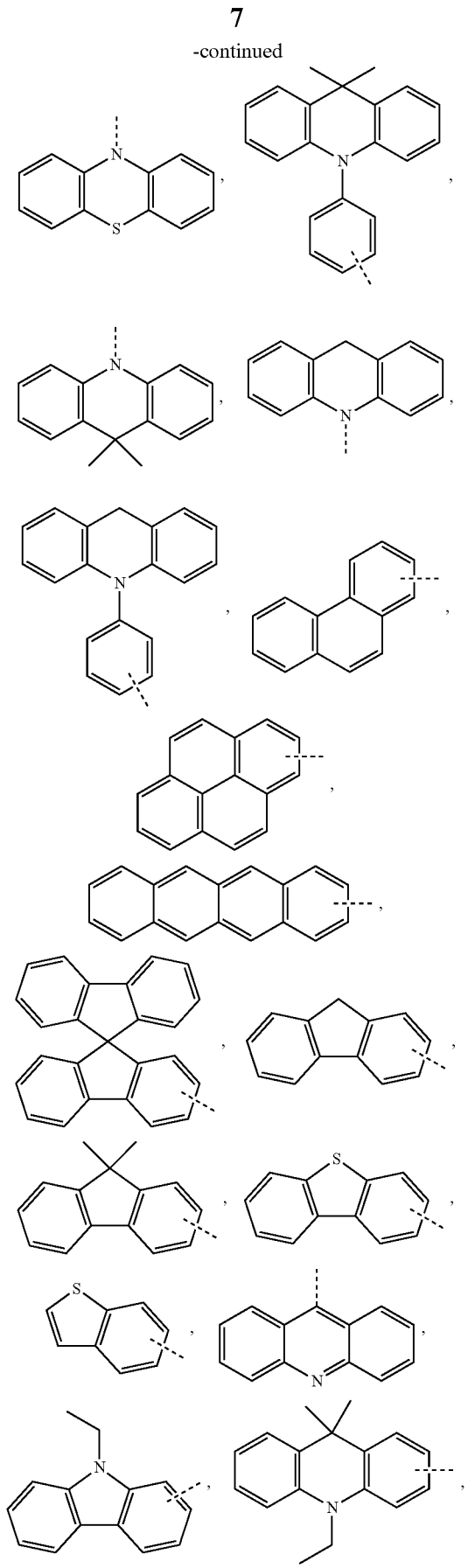

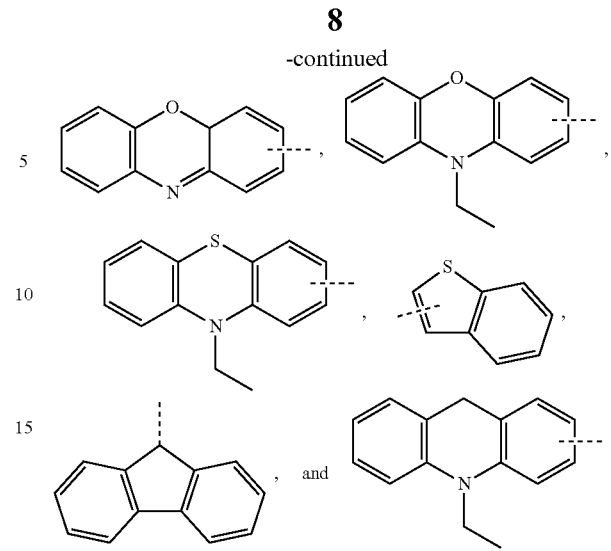

wherein, a dotted line represents a linkage site.

The substituent is selected from at least one of a group consisting of fluorine, chlorine, a C1-C10 (for example, C2, C3, C4, C5, C6, C7, C8 or C9) linear or branched alkyl group, a C6-C20 (for example, C7, C9, C10, C12, C14, C15, C17 or C19, etc.) aryl group, a C1-C10 (for example, C2, C3, C4, C5, C6, C7, C8 or C9) alkoxyl group, a C6-C20 (for example, C7, C9, C10, C12, C14, C15, C17 or C19, etc.) arylamino group and a C3-C20 (for example, C4, C6, C7, C9, C10, C12, C14, C15, C17 or C19, etc.) cycloalkyl group.

In one embodiment, the thermally activated delayed fluorescent material is a compound comprising a structure represented by Formula III:

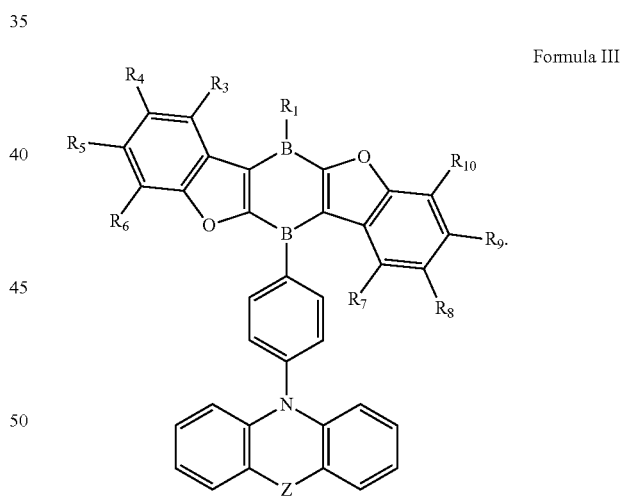

Formula III

In Formula III, Z is S, O N—R, or $R_s$—C—$R_t$; $R_v$, $R_s$ and $R_t$ each is independently selected from any one of a group consisting of hydrogen, fluorine, chlorine, a C1-C10 (for example, C2, C3, C4, C5, C6, C7, C8 or C9) linear or branched alkyl group, a C6-C20 (for example, C7, C9, C10, C12, C14, C15, C17 or C19, etc.) aryl group, and a C3-C20 (for example, C4, C6, C7, C9, C10, C12, C14, C15, C17 or C19, etc.) heteroaryl group.

In Formula III, $R_1$ and $R_3$-$R_{10}$ each independently has the same limited range as described above for $R_1$ and $R_3$-$R_{10}$.

In one embodiment, the thermally activated delayed fluorescent material is a compound comprising a structure represented by Formula IV:

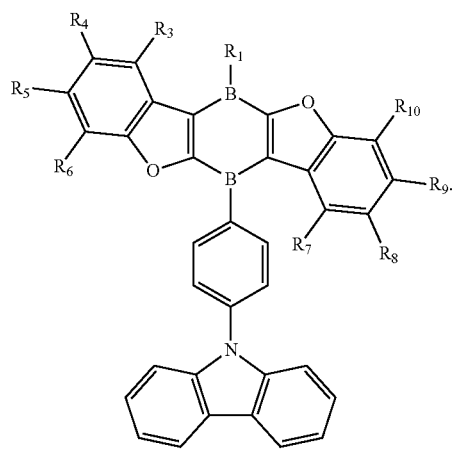

Formula IV

In Formula IV, $R_1$ and $R_3$-$R_{10}$ each independently has the same limited range as described above for $R_1$ and $R_3$-$R_{10}$.

In one embodiment, the thermally activated delayed fluorescent material is a compound comprising a structure represented by Formula V:

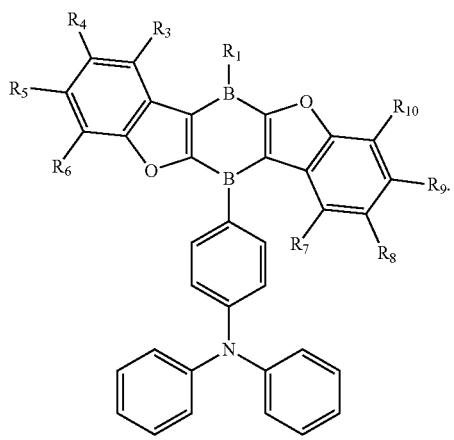

Formula V

In Formula V, $R_1$ and $R_3$-$R_{10}$ each independently has the same limited range as described above for $R_1$ and $R_3$-$R_{10}$.

In one embodiment, $R_1$ group and $R_2$ group are the same.

In one embodiment, $R_3$-$R_{10}$ each is independently selected from any one of a group consisting of hydrogen, fluorine, chlorine, a substituted or unsubstituted C1-C10 (for example, C2, C3, C4, C5, C6, C7, C8 or C9) linear or branched alkyl group, a substituted or unsubstituted C6-C12 (for example, C7, C8, C9, C10 or C11) aryl group, and a substituted or unsubstituted C3-C12 (for example, C4, C5, C6, C7, C8, C9, C10 or C11) heteroaryl group.

When a substituent exists in the above groups, the substituent is selected from at least one of a group consisting of fluorine, chlorine, a C1-C10 (for example, C2, C3, C4, C5, C6, C7, C8 or C9) alkoxyl group, hydroxyl group, carboxyl group, a C1-C10 (for example, C2, C3, C4, C5, C6, C7, C8 or C9) linear or branched alkyl group, and a C6-C20 (for example, C7, C9, C10, C12, C14, C15, C17 or C19, etc.) arylamino group.

In one embodiment, $R_3$-$R_{10}$ are all hydrogen.

In one embodiment, any two adjacent groups among $R_3$-$R_{10}$ are linked to form a ring or fused with each other.

In one embodiment, the thermally activated delayed fluorescent material has an energy level difference between the lowest singlet state $S_1$ and the lowest triplet state $T_1$ of $\Delta E_t = E_{S1} - E_{T1} \leq 0.25$ eV, for example, 0.24 eV, 0.23 eV, 0.22 eV, 0.21 eV, 0.20 eV, 0.19 eV, 0.18 eV, 0.16 eV, 0.14 eV, 0.13 eV, 0.12 eV, 0.11 eV, 0.10 eV, 0.09 eV, 0.08 eV, 0.07 eV, 0.06 eV, 0.05 eV, 0.04 eV, 0.03 eV, 0.02 eV or 0.01 eV, etc.

In one embodiment, the thermally activated delayed fluorescent material comprises any one or a combination of at least two of the following compounds M1 to M87:

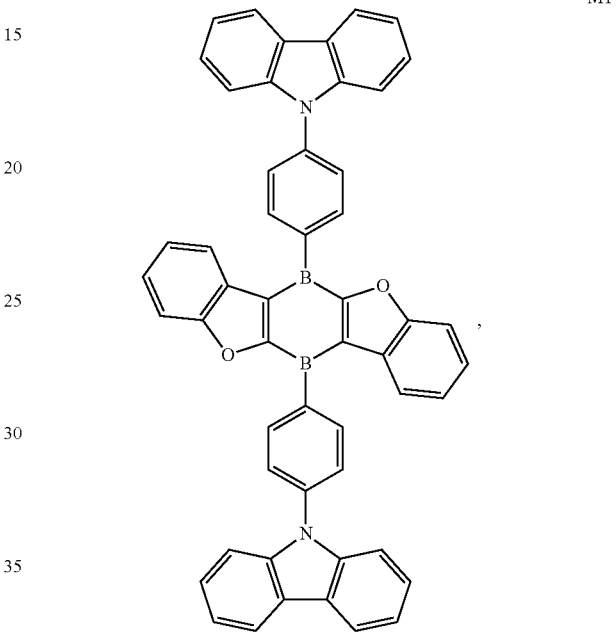

M1

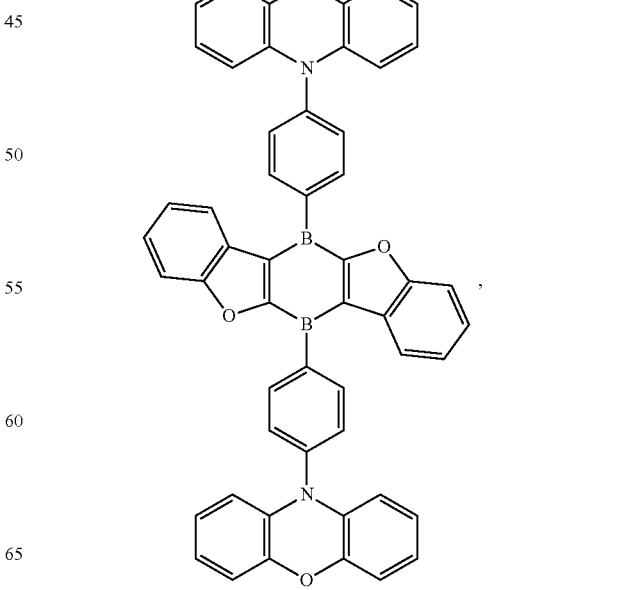

M2

M3
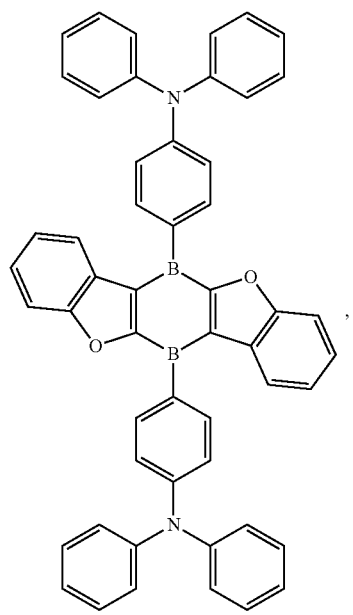
M4
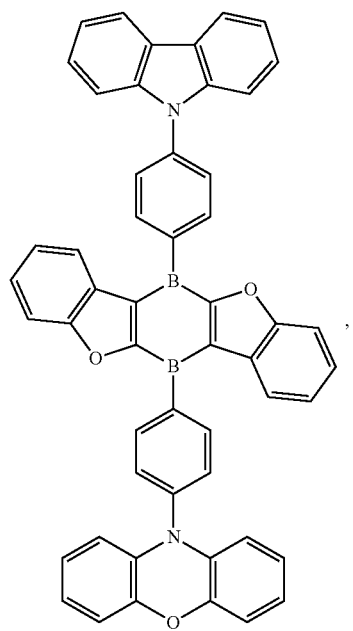
M5
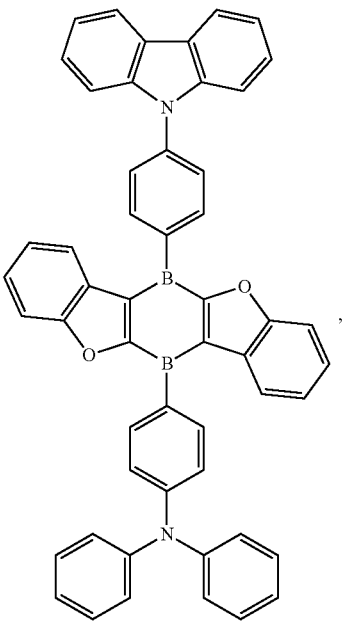
M6
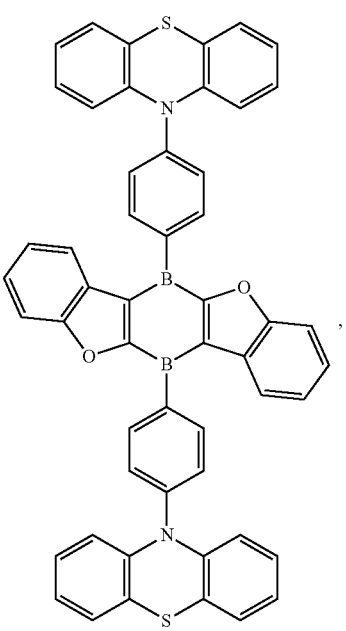

M7
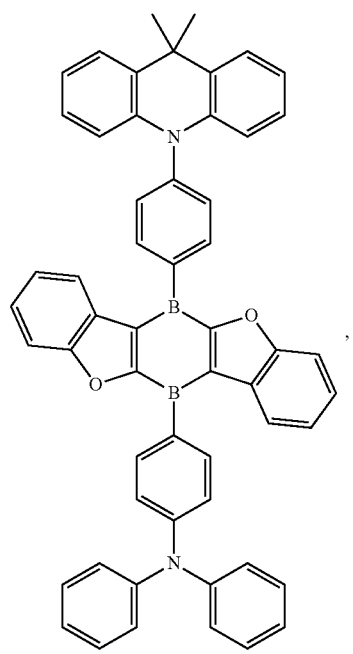
M8
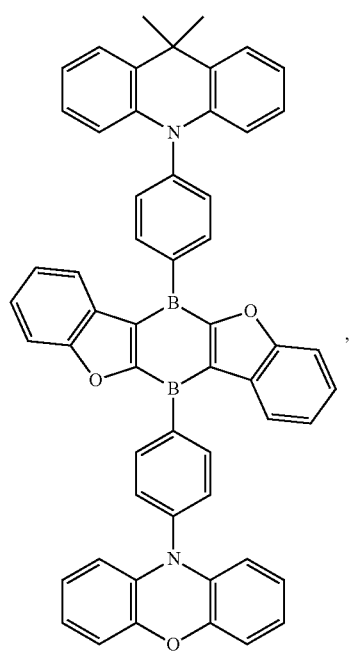
M9
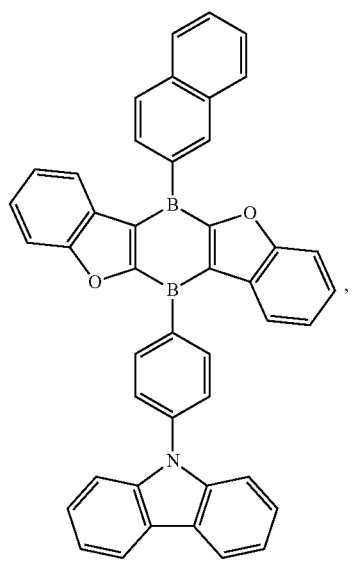
M10
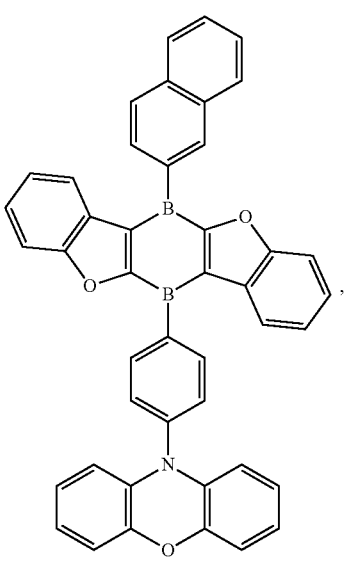
M11
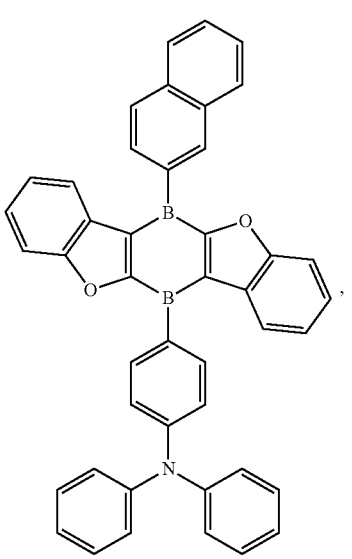

M12
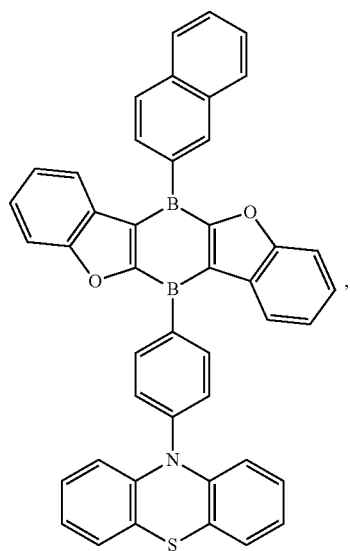
M14
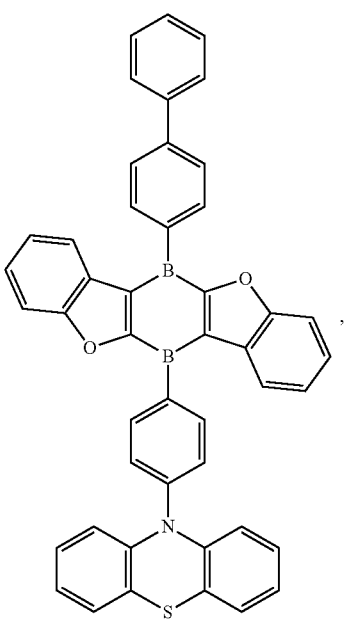
M13
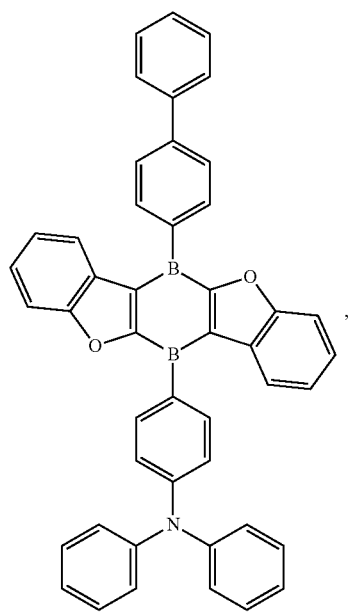
M15
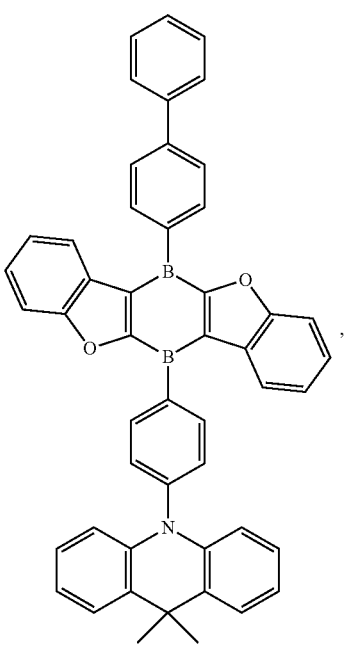

-continued
M16
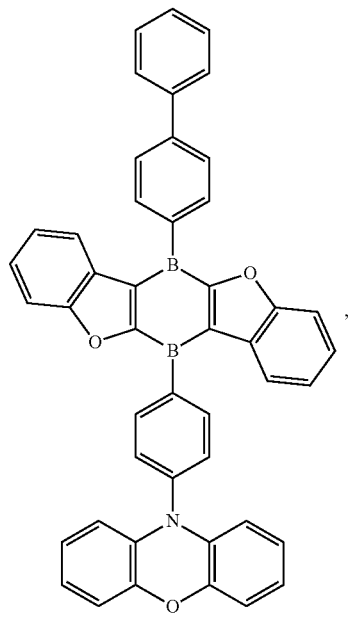
M17
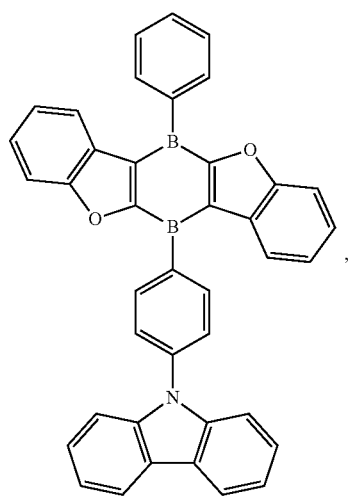
M18
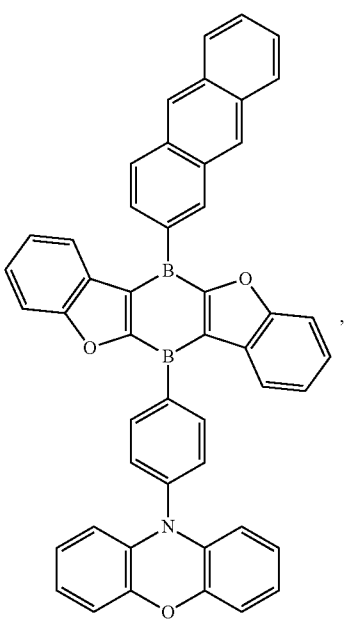
M19
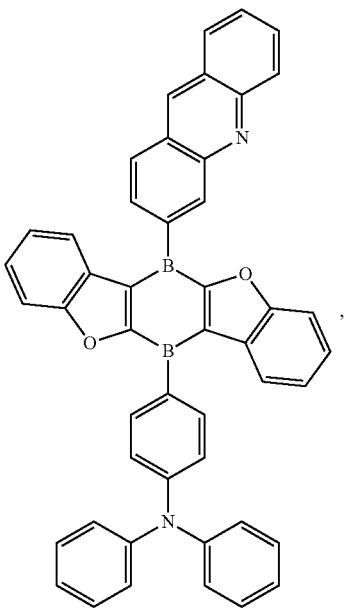

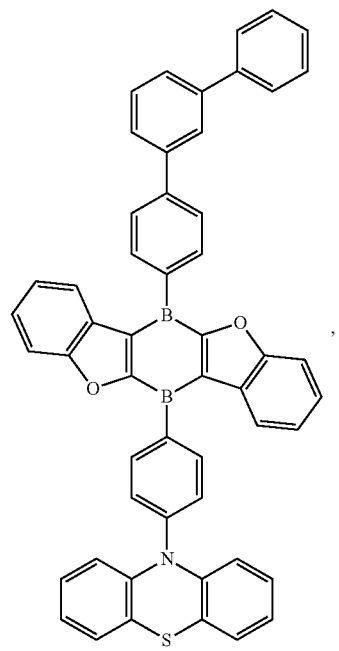
M20
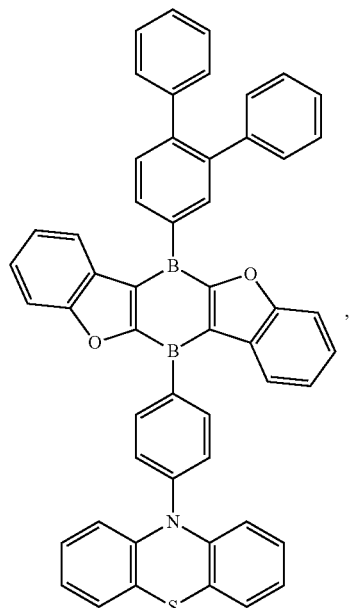
M22
M21
M23

M24
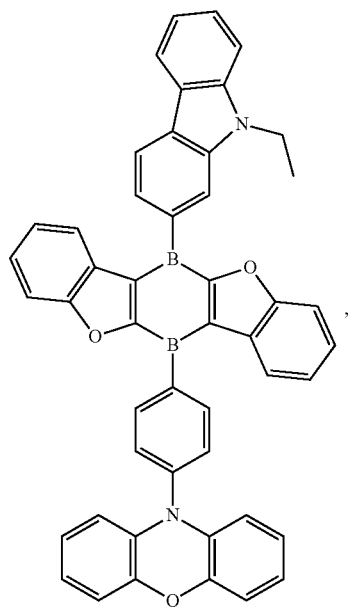
M25
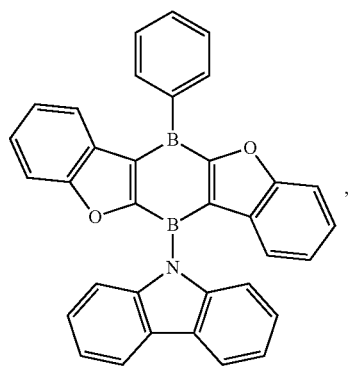
M26
M27
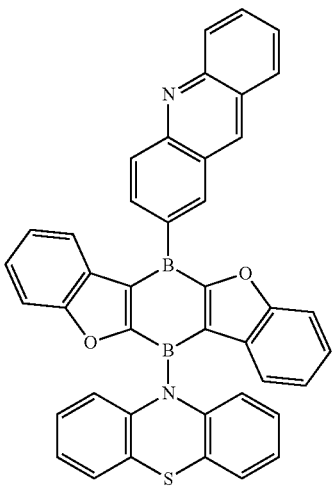
M28
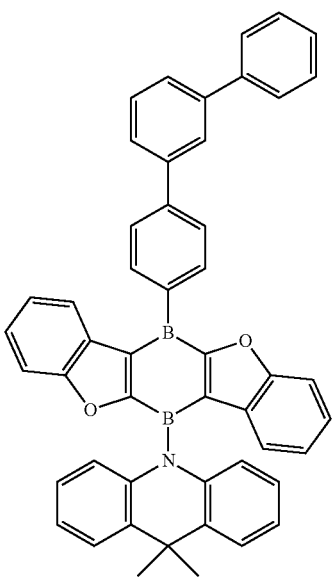
M29
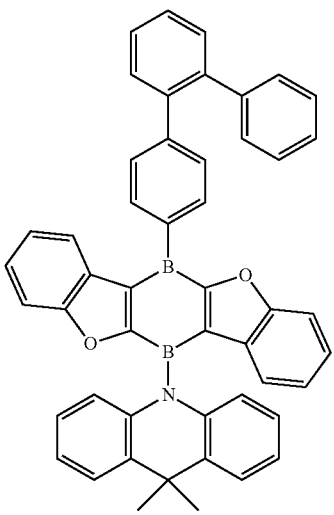

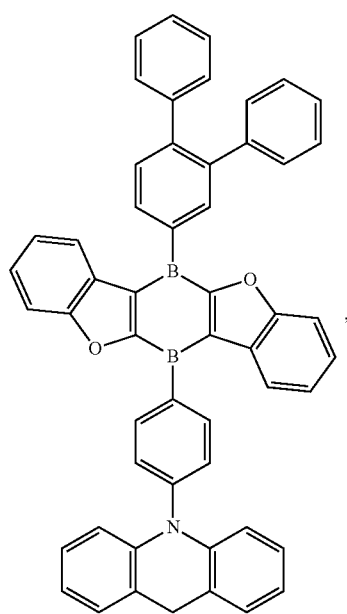
M30
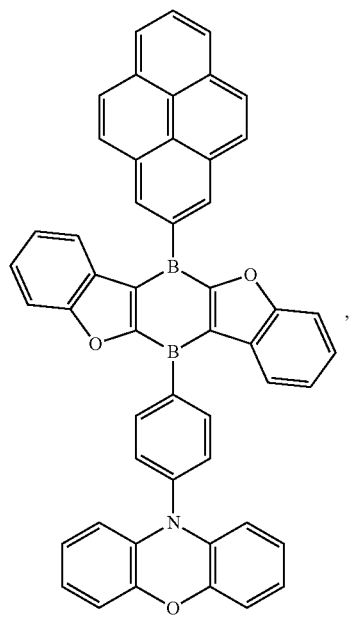
M32
M31
M33

M34
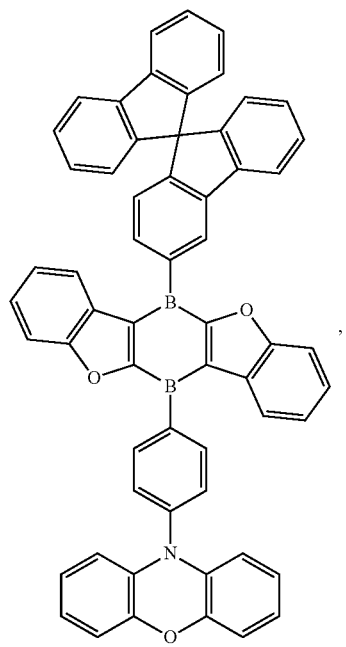
M35
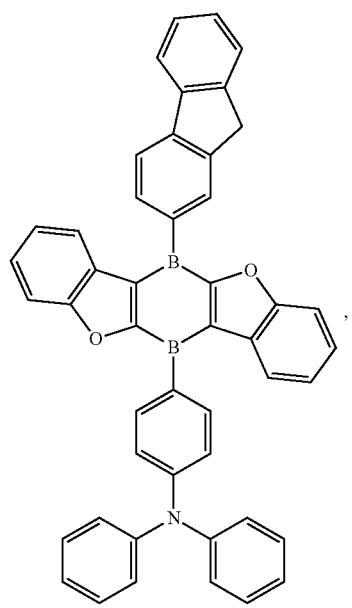
M36
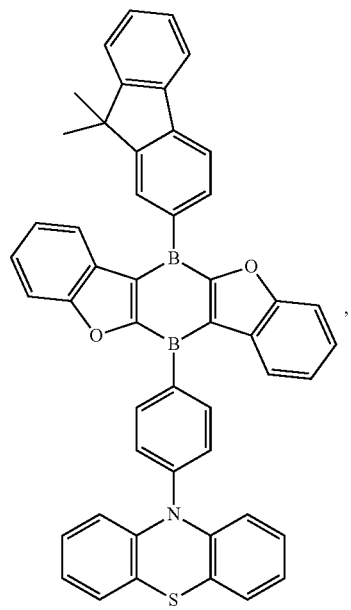
M37
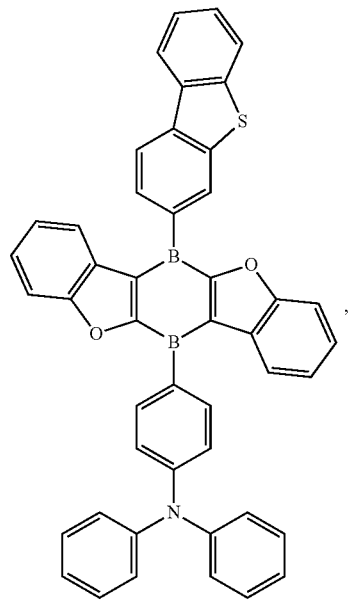

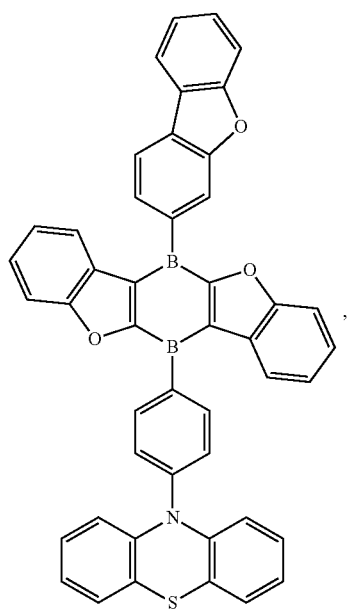
M38
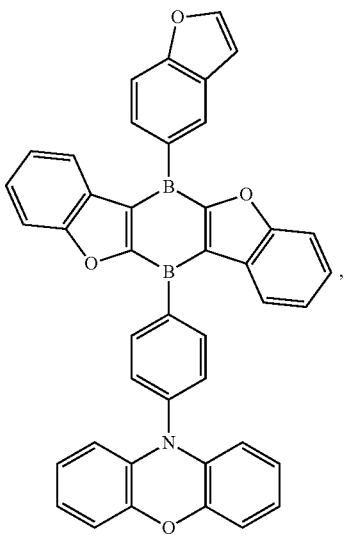
M40
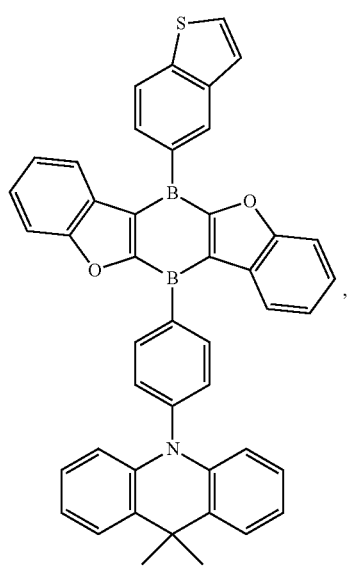
M39
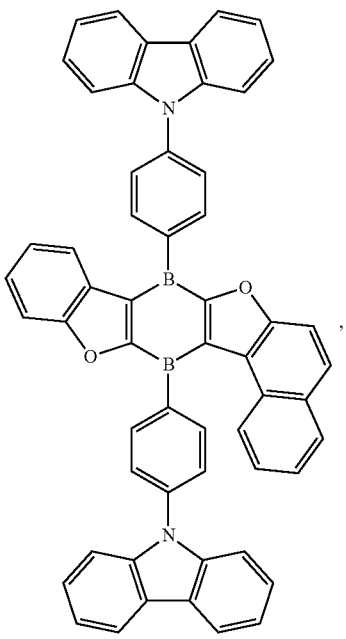
M41

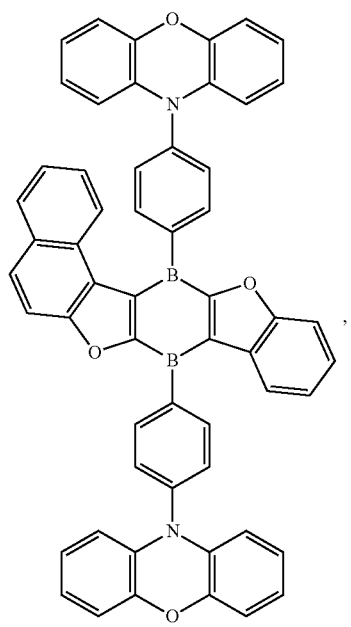
M42
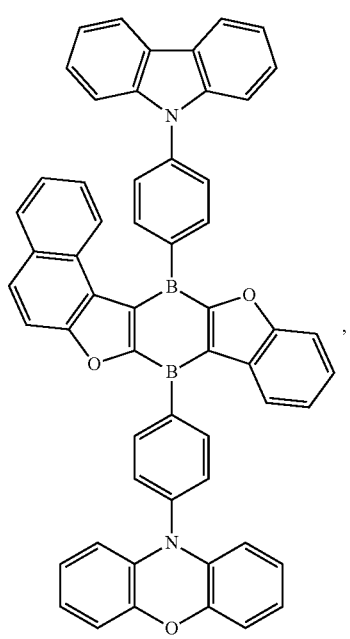
M44
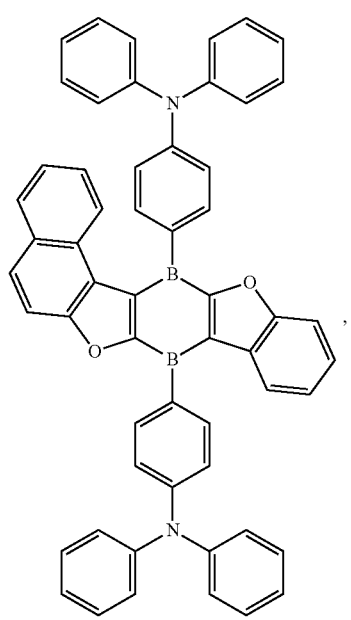
M43
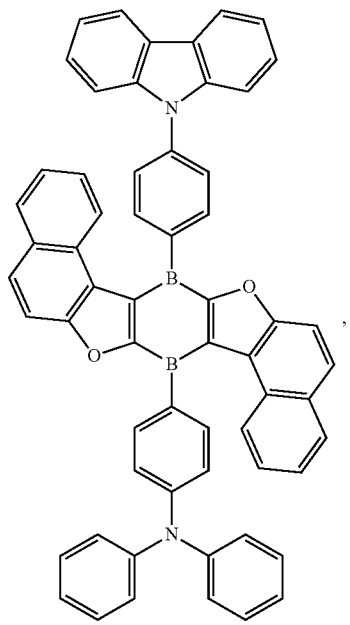
M45

M46
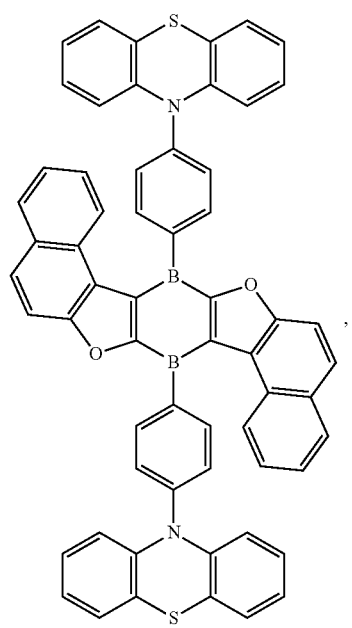
M47
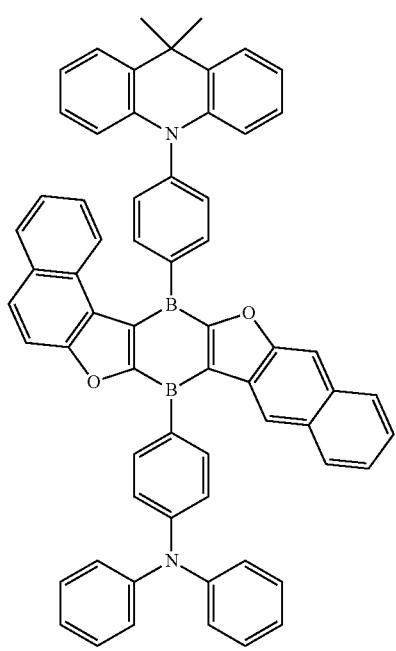
M48
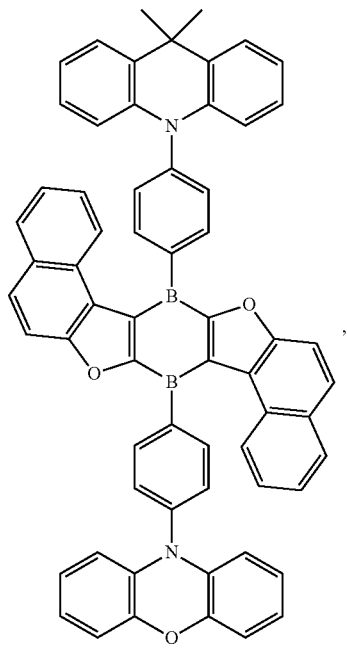
M49
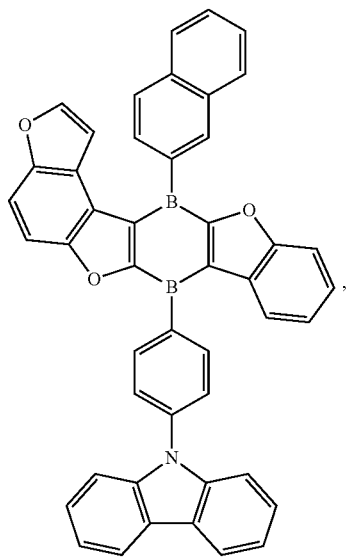

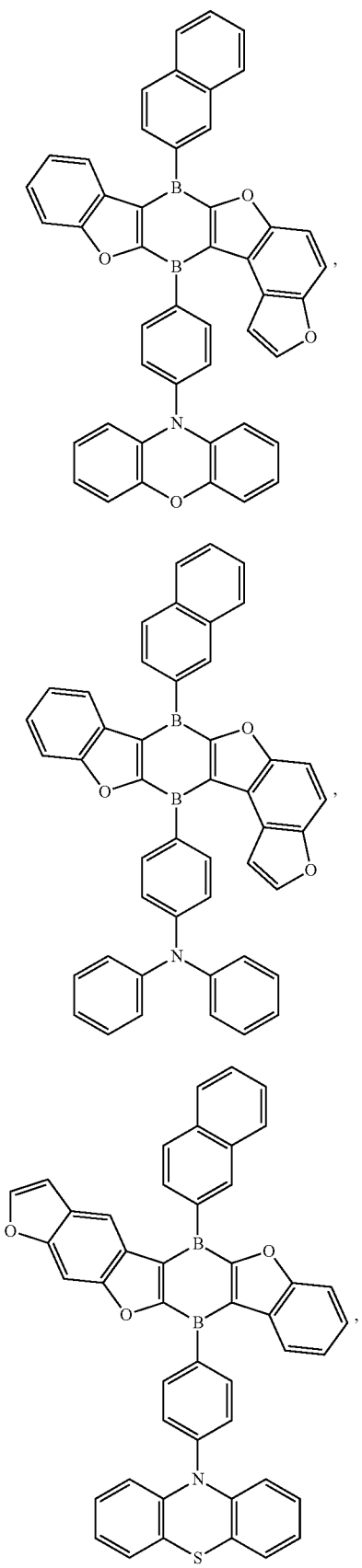
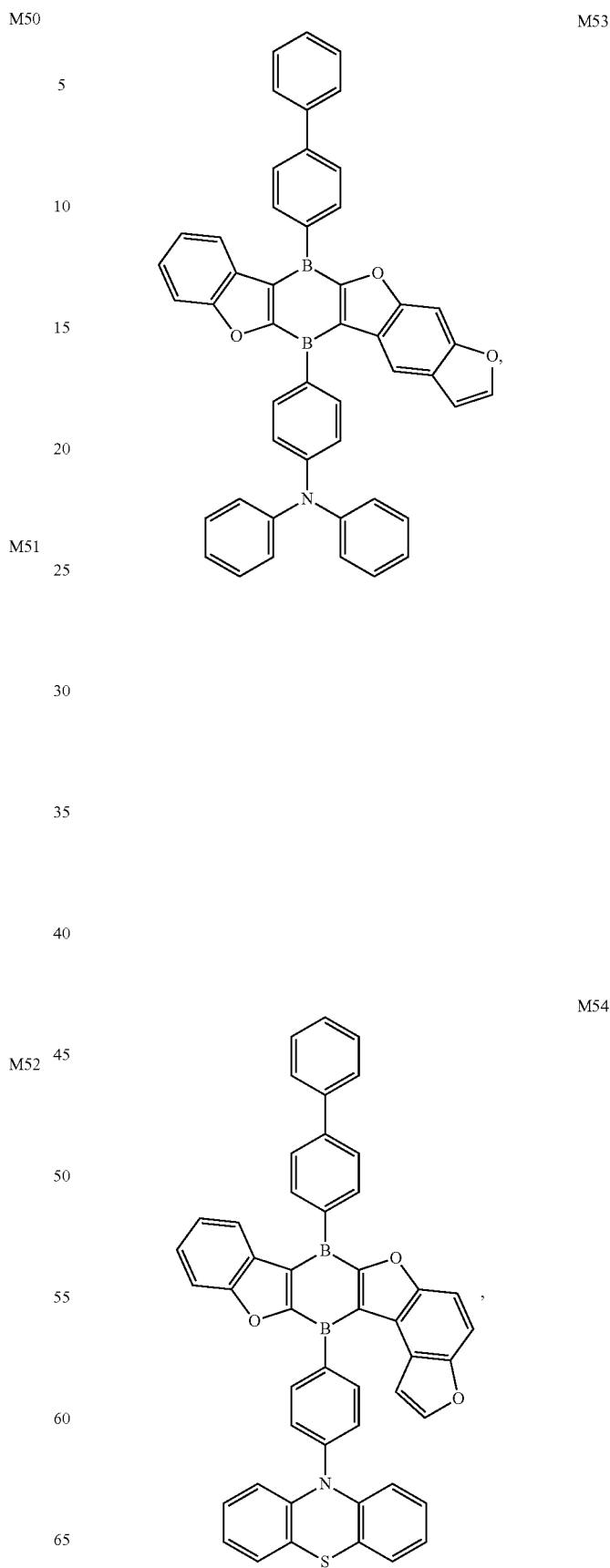

M55
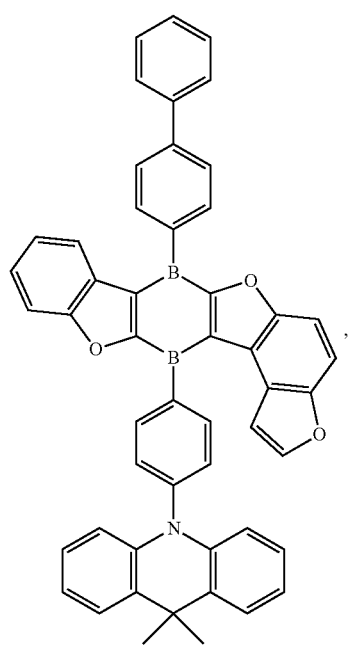
M56
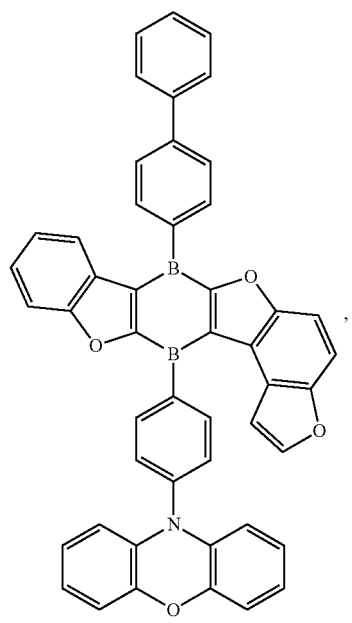
M57
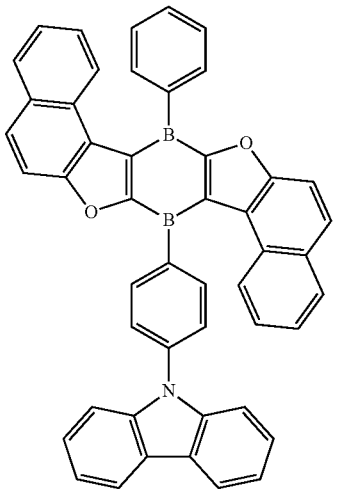
M58
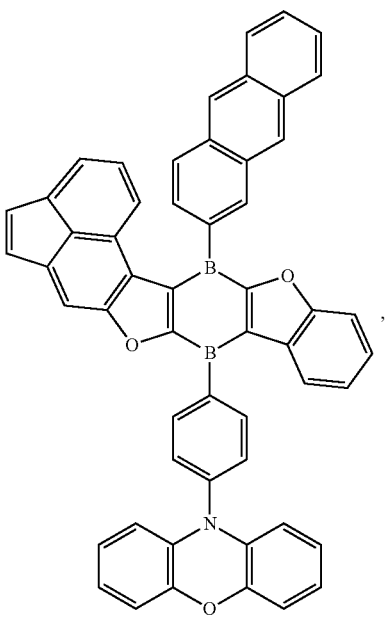

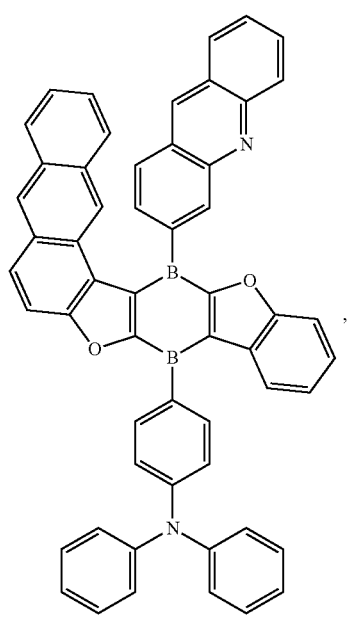
M59
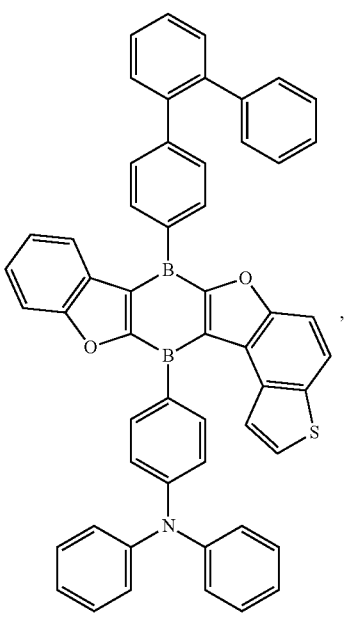
M61
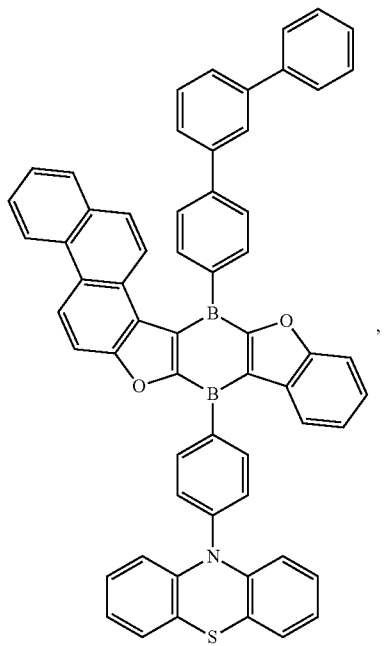
M60
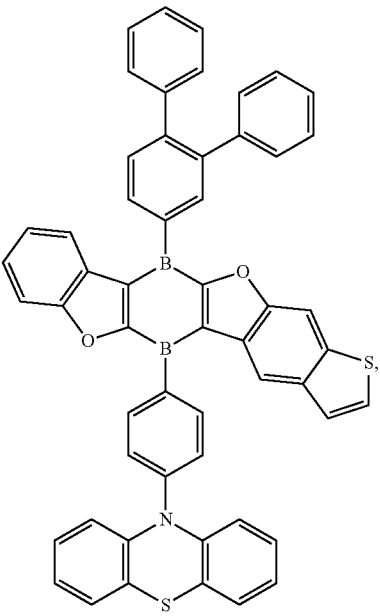
M62

M63
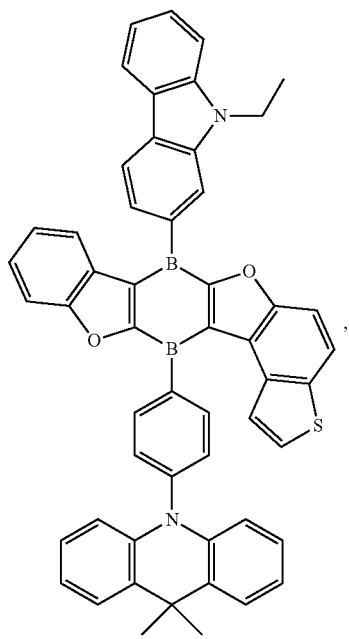
M64
M65
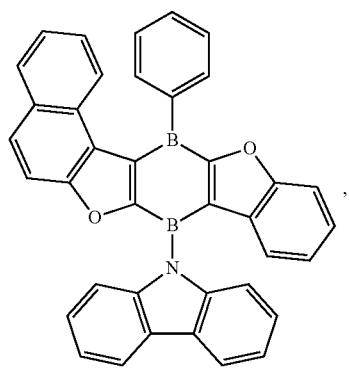
M66
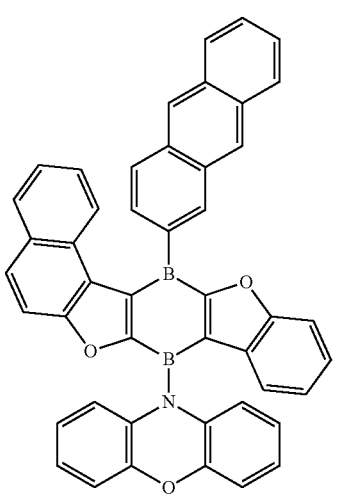
M67
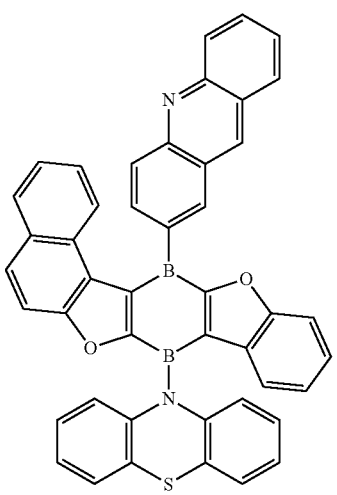
M68
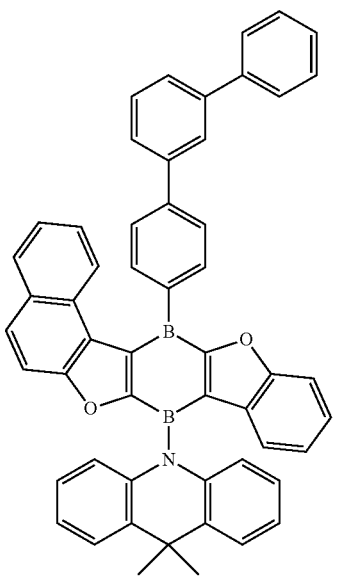

M69
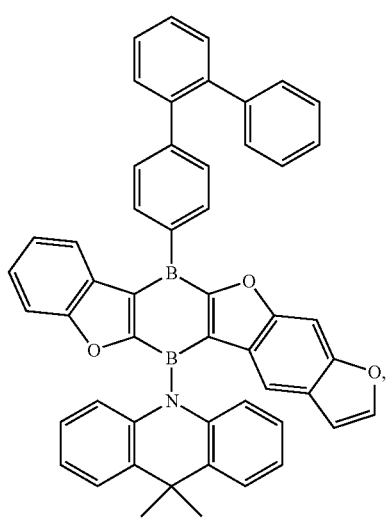
M70
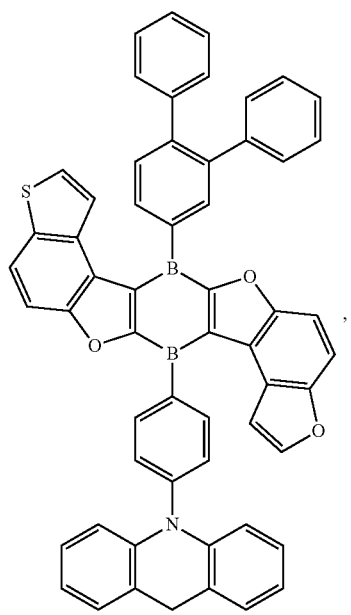
M71
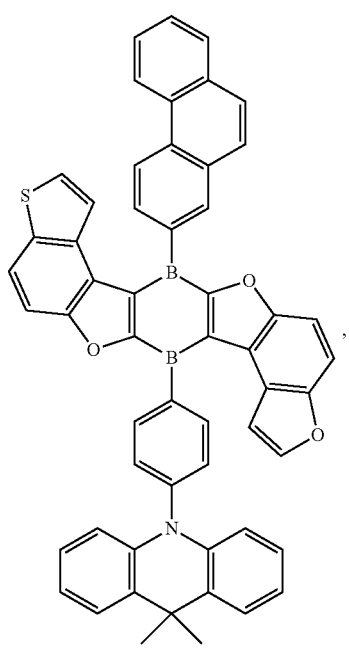
M72
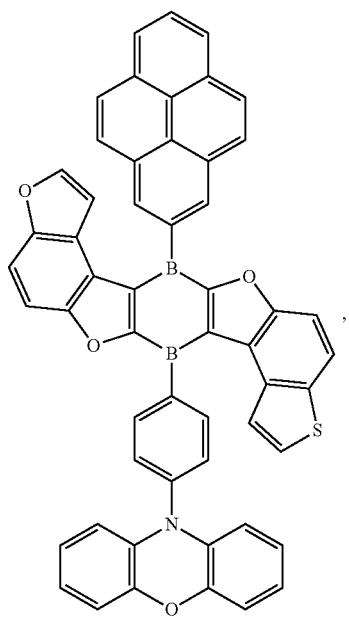

M73
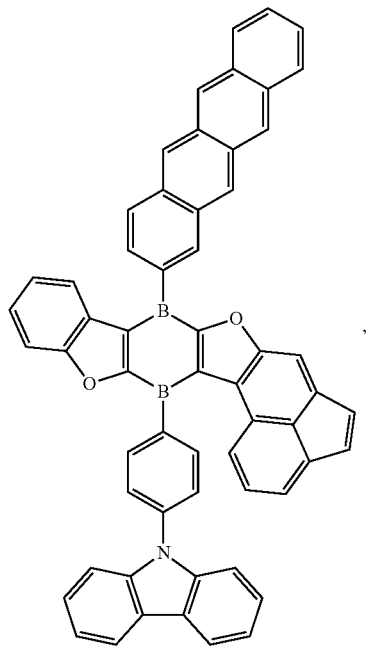
M75
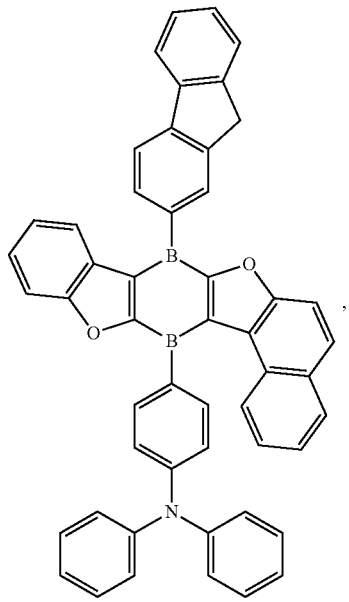
M74
M76
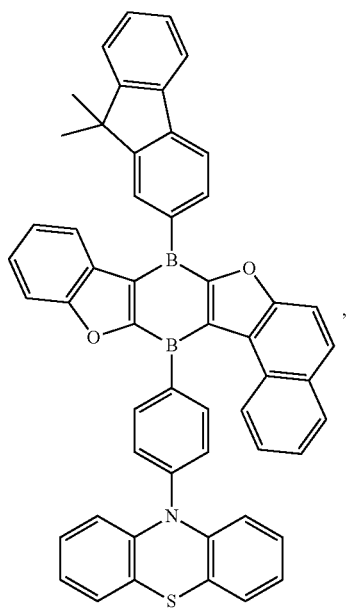

M77
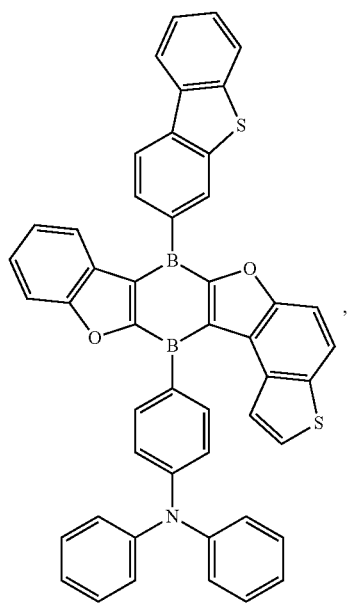
M78
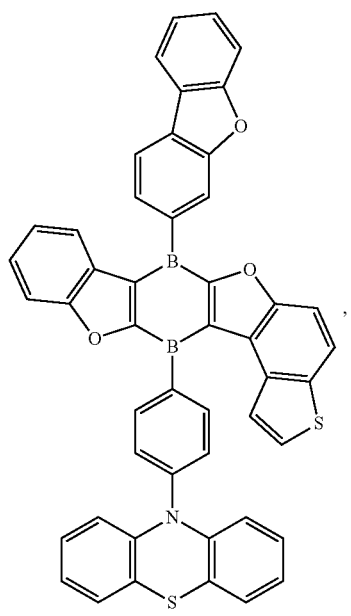
M79
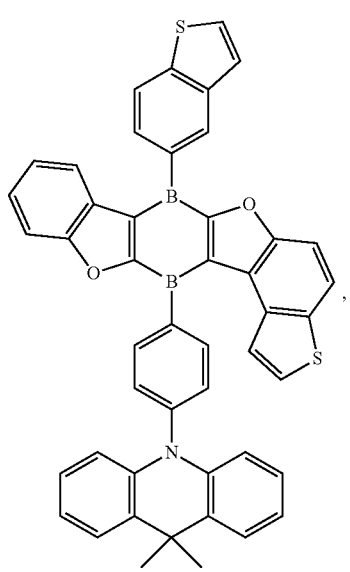
M80
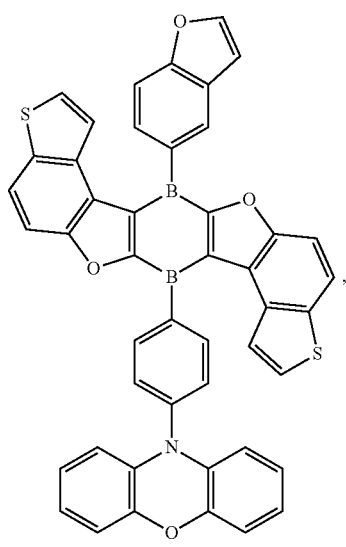

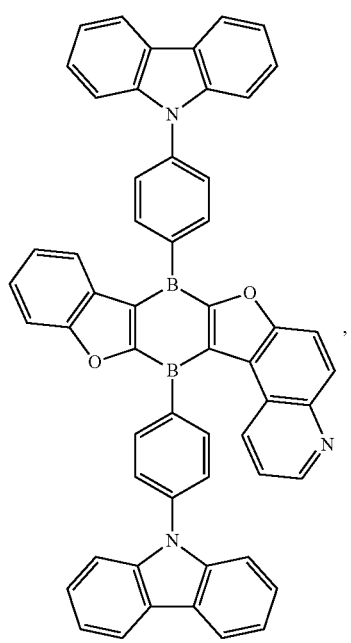
M81
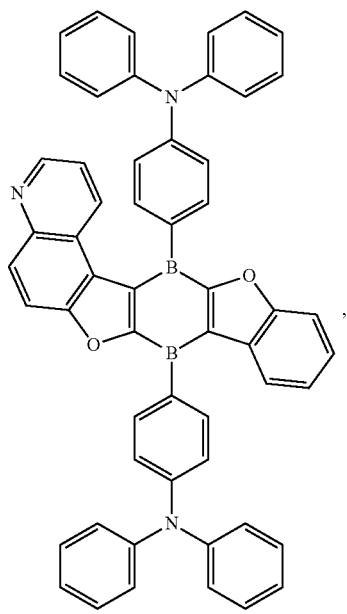
M83
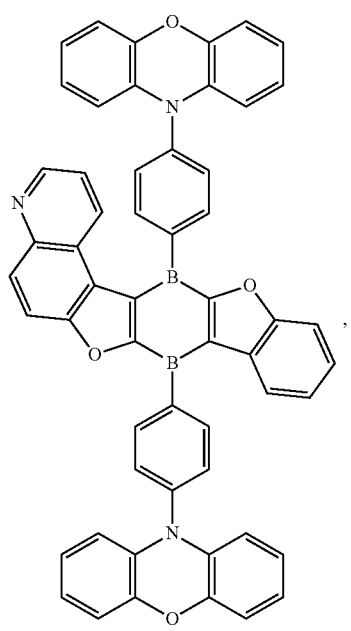
M82
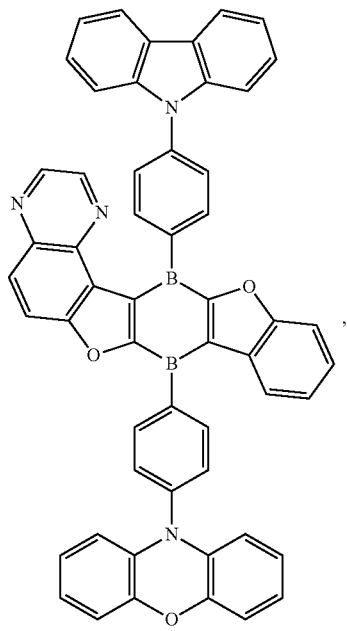
M84

-continued

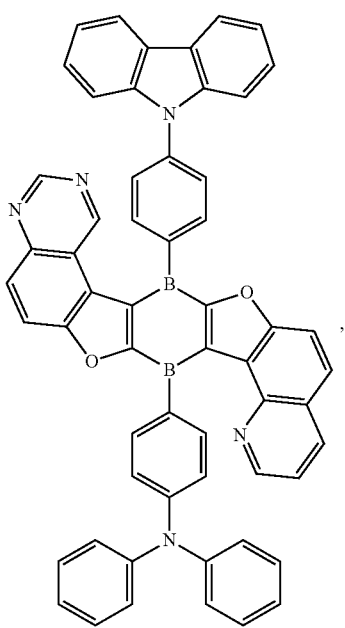
M85

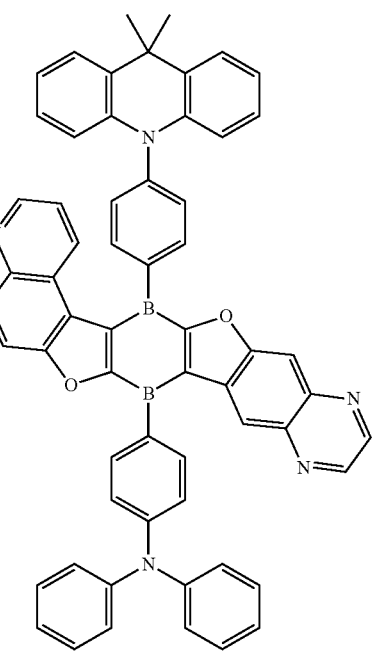
M87

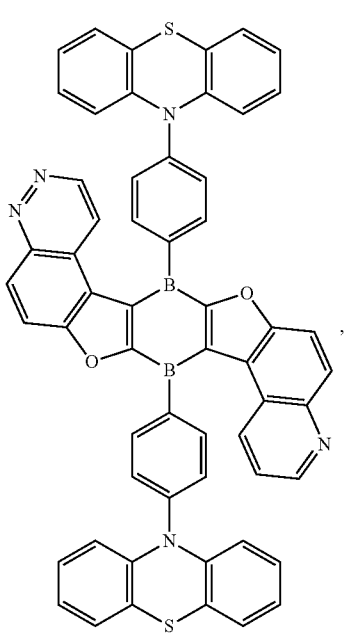
M86

The second object of the present disclosure is to provide a display panel comprising an OLED device, the OLED device comprises an anode, a cathode, and at least one organic thin film layer between the anode and the cathode, the organic thin film layer comprises a light-emitting layer, and any one or a combination of at least two of a hole transport layer, a hole injection layer, an electron blocking layer, a hole blocking layer, an electron transport layer, and an electron injection layer.

The light-emitting layer comprises the thermally activated delayed fluorescent material as described above, and the thermally activated delayed fluorescent material is used as any one of a guest material, a host material and a co-doped material.

In the OLED device, the anode material may be indium tin oxide (ITO), indium zinc oxide (IZO), or indium gallium zinc oxide (IGZO), etc.; and the cathode material may be a metal such as aluminum, magnesium, silver, indium, tin, or titanium, etc. The organic thin film layer includes a light-emitting layer and any one or a combination of at least two of a hole transport layer (HTL), a hole injection layer (HIL), an electron blocking layer (EBL), a hole blocking layer (HBL), an electron transport layer (ETL) and an electron injection layer (EIL) disposed on both sides of the light-emitting layer, wherein the hole/electron injection and transport layer may be a carbazole compound, an arylamine compound, a benzimidazole compound, or a metal compound, etc.

An energy level difference between the triplet state and the singlet state of the thermally activated delayed fluorescent material provided by the present disclosure can be reduced to below 0.25 eV, which satisfies reverse crossing of energy from the triplet state to the singlet state, and can be used as any one of a guest material, a host material and a co-doped material, making the OLED device have good luminescence properties.

In one embodiment, the light-emitting layer comprises a host material and a guest material, and the guest material comprises the thermally activated delayed fluorescent material as described above.

The third object of the present disclosure is to provide an electronic device comprising the display panel as described above.

The compound having a structure represented by Formula I provided by the present disclosure are exemplarily synthesized by the following synthetic route:

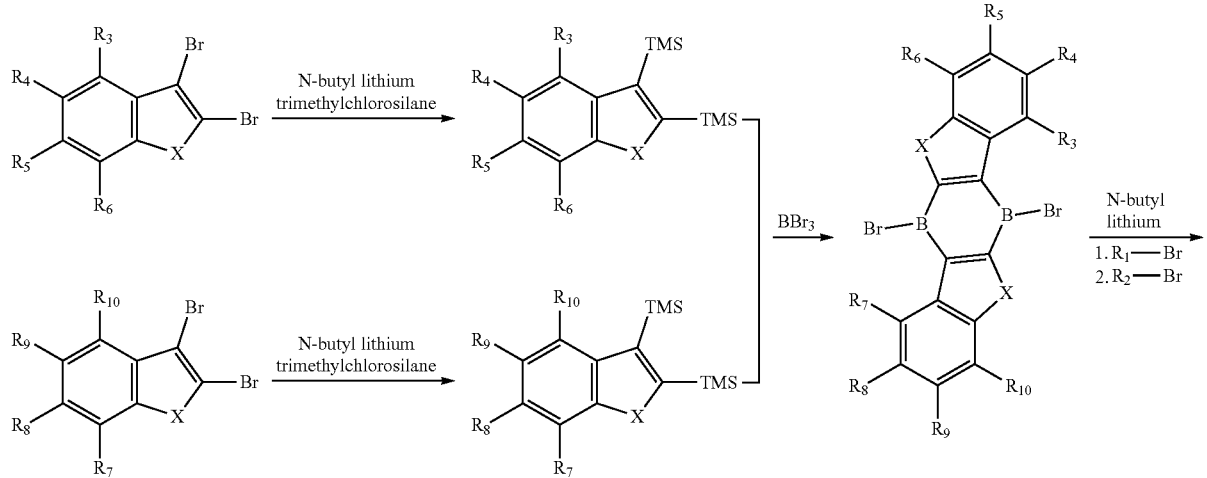

wherein $R_1$ and $R_2$ each is independently selected from any one of a group consisting of a substituted or unsubstituted C6-C60 aryl group and a substituted or unsubstituted C3-C60 heteroaryl group; X is selected from any one of a group consisting of O, S and N—$R_x$, $R_x$ is selected from any one of a group consisting of hydrogen, fluorine, chlorine, a substituted or unsubstituted C1-C30 alkyl group, a substituted or unsubstituted C3-C30 cycloalkyl group, a substituted or unsubstituted C3-C20 heterocycloalkyl group, a substituted or unsubstituted C6-C60 aryl group, and a substituted or unsubstituted C3-C60 heteroaryl group; $R_3$-$R_{10}$ each is independently selected from any one of a group consisting of hydrogen, fluorine, chlorine, a substituted or unsubstituted C1-C30 alkyl group, a substituted or unsubstituted C3-C30 cycloalkyl group, a substituted or unsubstituted C3-C20 heterocycloalkyl group, a substituted or unsubstituted C6-C60 aryl group, and a substituted or unsubstituted C3-C60 heteroaryl group; $R_3$-$R_{10}$ are not linked to each other or at least two of them adjacent to each other are linked to form a ring or fused with each other; and TMS is a trimethylsilyl group.

Example 1

This Example provides a thermally activated delayed fluorescent material having the following structure:

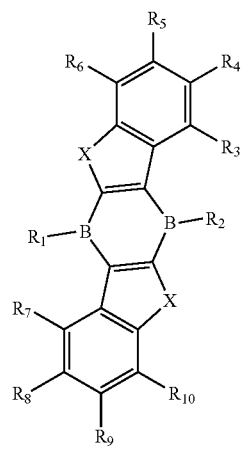

M1

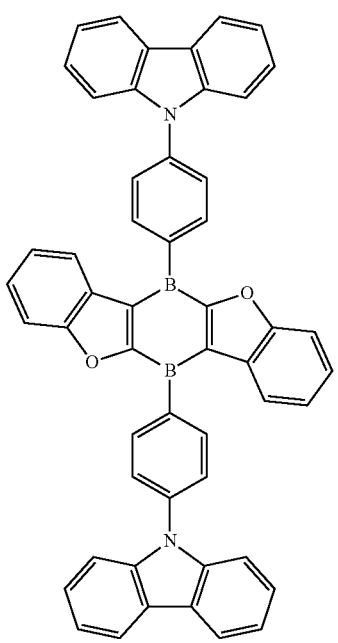

The preparation method thereof is as follows:

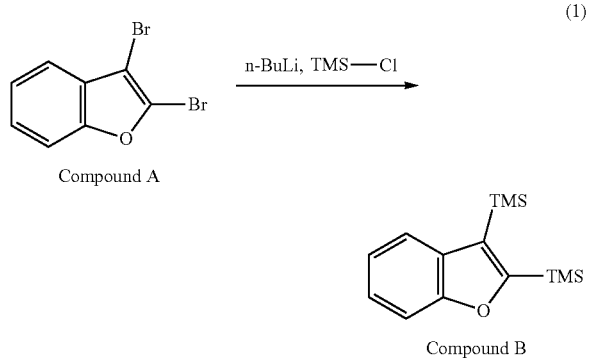

3.92 g (14.36 mmol) of Compound A was added to a reaction flask, then dissolved in 80 mL of tetrahydrofuran (THF), and replaced with nitrogen three times. The temperature was lowered to −78° C. and controlled below −65° C. under which 14.36 mL of n-butyllithium (n-BuLi, 2.5 mol/L) was added dropwise slowly, the mixture was stirred for 30 min after the completion of addition. Further, trimethylchlorosilane (TMS-Cl, 3.9 g, 35.9 mmol) was added dropwise slowly thereto, and the mixture was heated to 0° C. and reacted for 4 h. After the completion of reaction, the reaction was quenched by the addition of 100 mL of ice water; a product was extracted twice with dichloromethane and once with saturated brine. An organic phase was collected and evaporated by rotary evaporator to give a pale yellow oil; which was crystallized using toluene/ethanol to give a pale yellow solid compound B.

The structure of compound B was tested: MALDI-TOF-MS (m/z) was obtained by Matrix assisted laser desorption ionization time-of-flight mass spectrometry: theoretical value: 262, test value: 262.12.

$^1$H NMR (400 MHz, CDCl$_3$): δ 7.59 (s, 1H), 7.50 (s, 1H), 7.28 (s, 1H), 7.22 (s, 1H).

$^{13}$C NMR (100 MHz, CDCl$_3$): δ 190.17 (s), 152.34 (s), 135.05 (s), 125.09 (s), 123.76 (s), 120.93 (s), 113.44 (s), 66.58 (s), 3.00 (d, J=19.1 Hz).

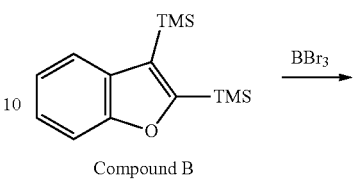

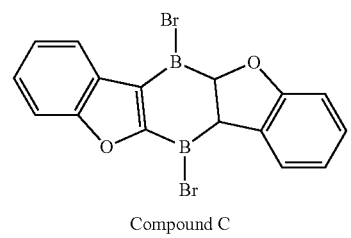

3.39 g (12.93 mmol) of compound B was added to a sealed pot, 70 mL of anhydrous toluene was added, and finally 2.57 mL of boron tribromide (27.15 mmol) was added, stirred at 120° C. for 12 h; after the completion of reaction, 100 mL of water was slowly added to quench the reaction. The reaction solution was extracted three times with dichlorotoluene, and finally extracted once with saturated brine. The organic phase was collected and stirred with anhydrous magnesium sulfate, filtered, the filtrate was evaporated by rotary evaporator to remove solvent, then crystallized using dichloromethane/ethanol to give a white solid compound C. MALDI-TOF:

The structure of compound C was tested: MALDI-TOF-MS (m/z) was obtained by Matrix assisted laser desorption ionization time-of-flight mass spectrometry: theoretical value: 413, test value: 413.91.

$^1$H NMR (400 MHz, CDCl$_3$): δ 7.58 (s, 2H), 7.49 (s, 2H), 7.27 (s, 2H), 7.21 (s, 2H).

$^{13}$C NMR (100 MHz, CDCl$_3$): δ 156.72 (s), 123.57 (s), 123.36 (s), 121.98 (s), 121.57 (s), 112.83 (s).

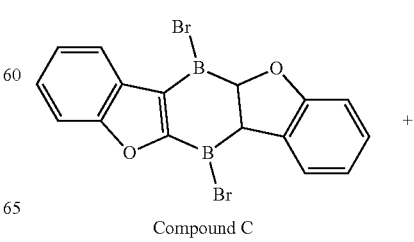

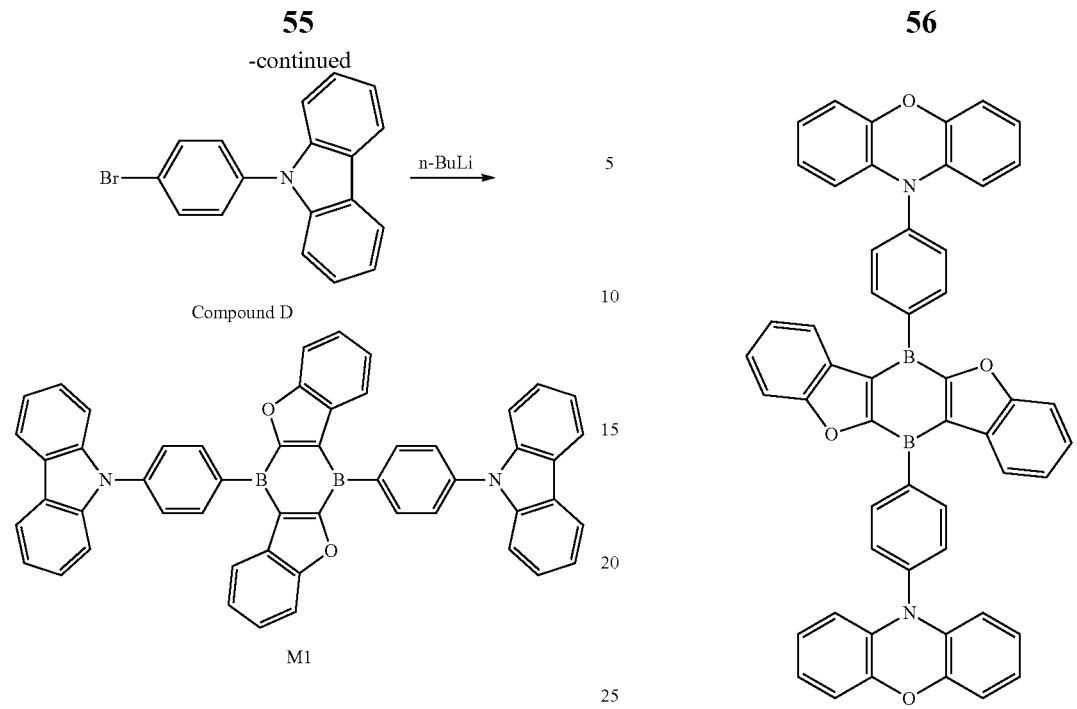

Compound D

M1

M2

7.85 g (19 mmol) of Compound C was added to the reaction flask, dissolved in 50 mL of diethyl ether, and replaced with nitrogen three times; the temperature was lowered to −78° C. and controlled below −65° C., then 16.08 mL of n-butyllithium (n-BuLi, 2.5 mol/L) was added dropwise slowly, the mixture was stirred for 30 min after the completion of addition; 12.88 g (40 mmol) of Compound D was dissolved with 60 mL of toluene, which was then slowly added dropwise to the reaction solution. After the completion of addition, it was naturally raised to room temperature to react for 6 h. After the completion of reaction, 100 mL of ice water was added to quench the reaction; the reaction solution was extracted twice with dichloromethane, and extracted once with saturated brine; the organic phase was collected and evaporated by rotary evaporator to give a pale yellow oil. The product was purified by column chromatography (mobile phase of n-hexane/dichloromethane=3/1) to give a white solid M1. MALDI-TOF:

The structure of M1 was tested: MALDI-TOF-MS (m/z) obtained by Matrix assisted laser desorption ionization time-of-flight mass spectrometry: theoretical value: 738, test value: 738.26.

$^1$H NMR (400 MHz, CDCl$_3$): δ 8.55 (s, 2H), 8.19 (s, 2H), 7.89 (m, 4H), 7.74 (d, J=3.5 Hz, 4H), 7.59 (d, J=8.0 Hz, 2H), 7.51 (s, 4H), 7.40 (s, 2H), 7.28 (s, 4H), 7.17 (m 8H), 7.11 (m 2H).

$^{13}$C NMR (100 MHz, CDCl$_3$): δ 158.25 (s), 150.19 (s), 135.38 (s), 131.79 (s), 127.72 (s), 125.67 (s), 124.88 (s), 124.21 (s), 123.32 (s), 122.65 (s), 122.04 (s), 121.56 (s), 121.15 (d, J=2.7 Hz), 114.95 (s), 112.88 (s).

Example 2

This Example provides a thermally activated delayed fluorescent material having the following structure:

The preparation method in this Example is the same as that described in Example 1, except that the compound D in the step (3) is replaced with an equimolar amount of the compound D2

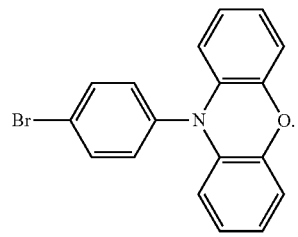 [SMILES: Brc1ccc(N2c3ccccc3Oc3ccccc32)cc1]

The structure of M2 was tested: MALDI-TOF-MS (m/z) was obtained by Matrix assisted laser desorption ionization time-of-flight mass spectrometry: theoretical value: 770, test value: 770.25.

$^1$H NMR (400 MHz, CDCl$_3$): δ 7.71 (s, 2H), 7.59 (s, 1H), 7.50 (s, 1H), 7.28 (s, 1H), 7.25-7.11 (m, 5H), 7.00 (d, J=12.0 Hz, 4H), 6.93 (s, 2H).

$^{13}$C NMR (100 MHz, CDCl$_3$): δ 158.25 (s), 153.20 (s), 146.79 (s), 132.27 (s), 131.04 (s), 128.85 (s), 124.21 (s), 123.78-123.21 (m), 122.65 (s), 122.04 (s), 121.56 (s), 119.00 (s), 116.41 (s), 112.88 (s).

Example 3

This Example provides a thermally activated delayed fluorescent material having the following structure:

M3

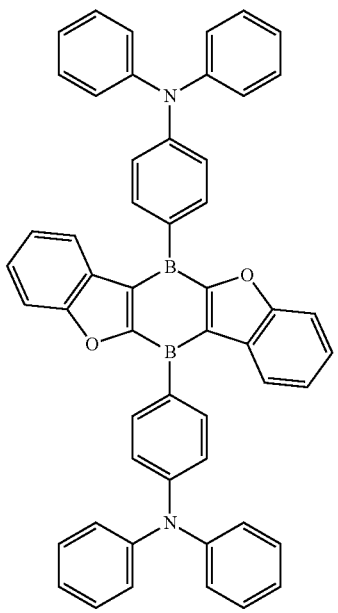

The preparation method in this Example is the same as that described in Example 1, except that the compound D in the step (3) is replaced with an equimolar amount of the compound D3

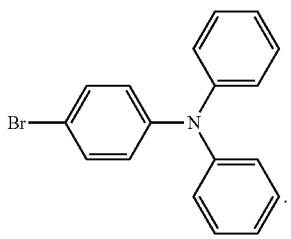

The structure of M3 was tested: MALDI-TOF-MS (m/z) was obtained by Matrix assisted laser desorption ionization time-of-flight mass spectrometry: theoretical value: 742, test value: 742.30.

$^1$H NMR (400 MHz, CDCl$_3$): δ 7.71 (s, 7H), 7.59 (s, 3H), 7.50 (s, 3H), 7.31-7.03 (m, 41H), 7.05-7.03 (m, 3H), 7.00 (s, 5H).

$^{13}$C NMR (100 MHz, CDCl$_3$): δ 158.25 (s), 151.41 (s), 146.93 (s), 131.24 (s), 129.27 (s), 128.34 (s), 124.67 (s), 124.21 (s), 123.32 (s), 122.99 (s), 122.65 (s), 122.04 (s), 121.56 (s), 112.88 (s).

Example 4

This Example provides a thermally activated delayed fluorescent material having the following structure:

M4

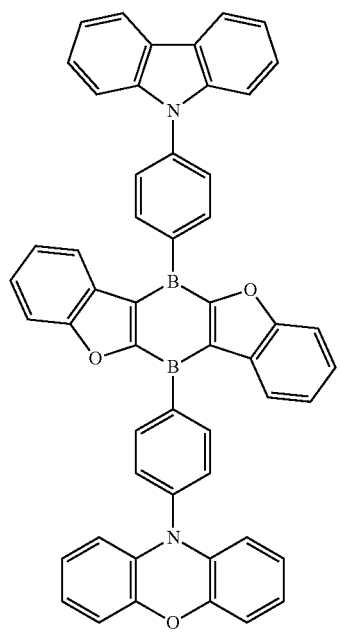

The preparation method in this Example is the same as that described in Example 1, except that the compound D in the step (3) is replaced with a mixture of 20 mmol of compound D4

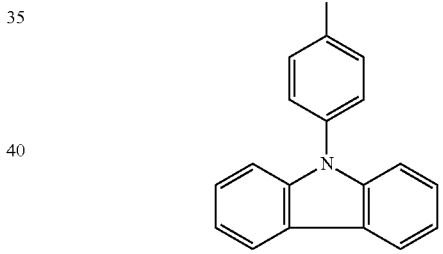

and 20 mmol of compound E

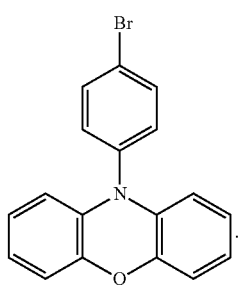 [SMILES: Brc1ccc(N2c3ccccc3Oc3ccccc32)cc1]

The structure of M4 was tested: MALDI-TOF-MS (m/z) was obtained by Matrix assisted laser desorption ionization time-of-flight mass spectrometry: theoretical value: 754, test value: 754.26.

$^1$H NMR (400 MHz, CDCl$_3$): δ 8.55 (s, 13H), 8.19 (s, 11H), 7.78 (t, J=36.0 Hz, 78H), 7.68 (s, 2H), 7.59 (s, 23H), 7.51 (d, J=8.0 Hz, 38H), 7.40 (s, 11H), 7.28 (s, 25H), 7.17 (dt, J=28.0, 10.0 Hz, 124H), 7.00 (d, J=12.0 Hz, 47H), 6.93 (s, 25H).

$^{13}$C NMR (100 MHz, CDCl$_3$): δ 158.25 (s), 153.20 (s), 150.19 (s), 146.79 (s), 135.38 (s), 132.27 (s), 131.41 (s), 128.85 (s), 127.72 (s), 125.67 (s), 124.88 (s), 124.21 (s), 123.78-123.21 (m), 122.65 (s), 122.04 (s), 121.56 (s), 121.15 (d, J=2.7 Hz), 119.00 (s), 116.41 (s), 114.95 (s), 112.88 (s).

Example 5

This Example provides a thermally activated delayed fluorescent material having the following structure:

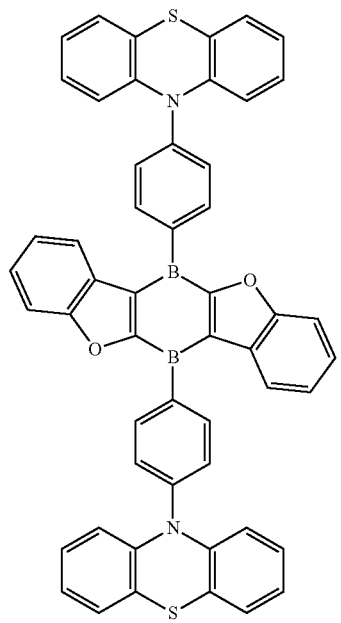

M6

The preparation method in this Example is the same as that described in Example 1, except that the compound D in the step 3) is replaced with an equimolar amount of the compound D5.

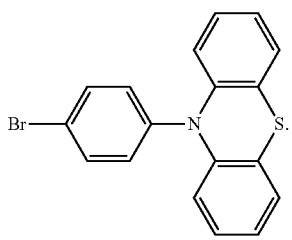

The structure of M6 was tested: MALDI-TOF-MS (m/z) was obtained by Matrix assisted laser desorption ionization time-of-flight mass spectrometry: theoretical value: 802, test value: 802.21.

$^1$H NMR (400 MHz, CDCl$_3$): δ 7.71 (s, 12H), 7.59 (s, 5H), 7.50 (s, 5H), 7.28 (s, 3H), 7.26-7.11 (m, 53H), 6.97 (s, 8H).

$^{13}$C NMR (100 MHz, CDCl$_3$): δ 158.25 (s), 153.20 (s), 141.45 (s), 131.04 (s), 128.85 (s), 127.11 (s), 126.62 (s), 124.30 (d, J=18.4 Hz), 123.32 (s), 122.68 (d, J=5.5 Hz), 122.04 (s), 121.56 (s), 115.74 (s), 112.88 (s).

Application Example 1

This application example provides an OLED device, and the OLED device comprises a substrate, an ITO anode, a hole injection layer, a hole transport layer, a hole injection layer, a light-emitting layer, a first electron transport layer, a second electron transport layer, a cathode (magnesium silver electrode, with a magnesium-silver mass ratio of 9:1) and a capping layer (CPL) in sequence, wherein the thickness of the ITO anode is 15 nm, the thickness of the hole injection layer is 10 nm, the thickness of the hole transport layer is 110 nm, the thickness of the light-emitting layer is 30 nm, the thickness of the first electron transport layer is 30 nm, the thickness of the second electron transport layer is 5 nm, the thickness of the magnesium-silver electrode is 15 nm, and the thickness of the capping layer (CPL) is 100 nm.

The preparation of the OLED device includes the following steps:

(1) cutting the glass substrate into a size of 50 mm×50 mm×0.7 mm, sonicating in isopropanol and deionized water for 30 minutes, respectively, and then exposing to ozone for about 10 minutes for cleaning; mounting the obtained glass substrate with ITO anode to a vacuum deposition apparatus;

(2) vacuum-evaporating the hole injection layer material HAT-CN on the ITO anode layer to a thickness of 10 nm under a vacuum degree of 2×10−6 Pa;

(3) evaporating TAPC as a hole transport layer having a thickness of 110 nm;

(4) co-depositing a light-emitting layer, wherein the thermally activated delayed fluorescent material M1 provided by Example 1 of the present disclosure was used as a dopant material for the light-emitting layer, 3,3'-bis(N-carbazolyl)-1,1'-biphenyl (mCBP) was used as a host material of the light-emitting layer, the mass ratio of M1 and mCBP was 1:9, and the thickness was 30 nm;

(5) vacuum-evaporating TPBi as a first electron transport layer to a thickness of 30 nm on the light-emitting layer;

(6) vacuum-evaporating Alq3 as a second electron transport layer to a thickness of 5 nm on the first electron transport layer;

(7) vacuum-evaporating a magnesium-silver electrode as a cathode to a thickness of 15 nm on the second electron transport layer; and (8) vacuum-evaporating CBP on the cathode as a cathode covering (capping layer) to a thickness of 100 nm.

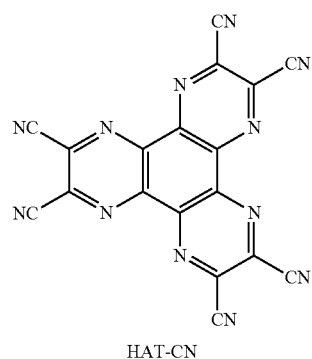

HAT-CN

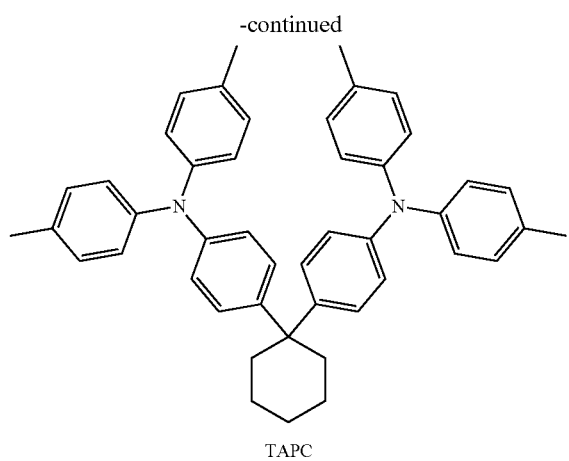

TAPC

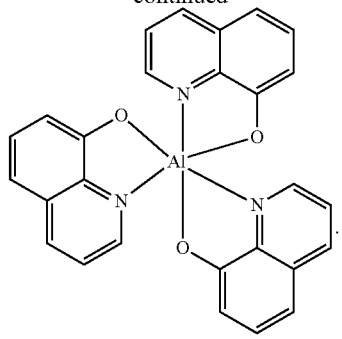

Alq3

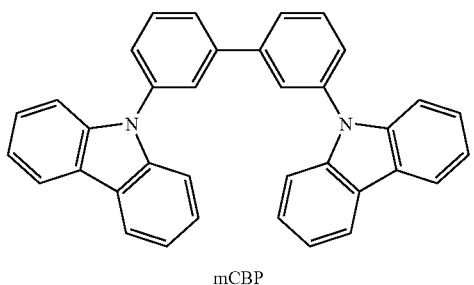

mCBP

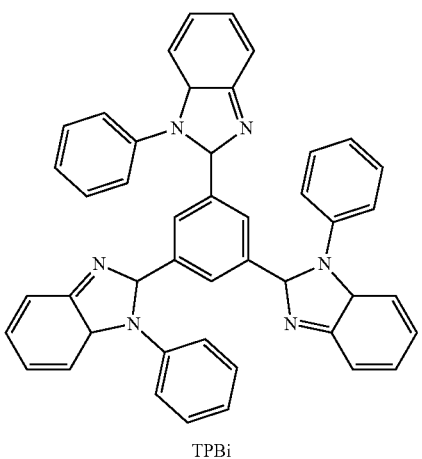

TPBi

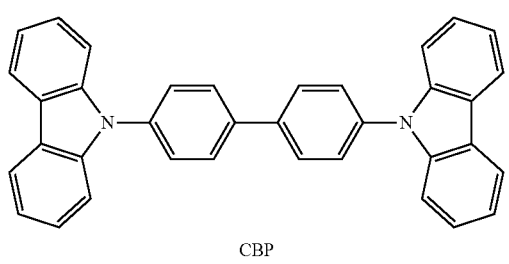

CBP

Application Example 2

This application example differs from the application example 1 in that M1 in the step (4) is replaced with M2.

Application Example 3

This application example differs from the application example 1 in that M1 in the step (4) is replaced with M3.

Application Example 4

This application example differs from the application example 1 in that M1 in the step (4) is replaced with M4.

Application Example 5

This application example differs from the application example 1 in that M1 in the step (4) is replaced with M6.

Comparative Example 1

This comparative example differs from the application example 1 in that M1 in the step (4) is replaced with ref(N,N'-diarylquinacridone

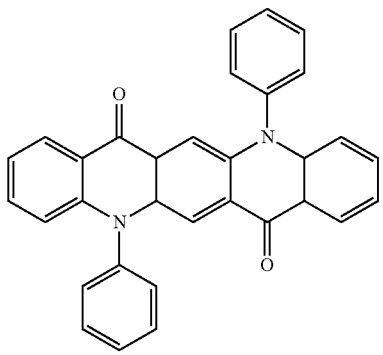

).

Performance Test:
(1) Simulation Calculation of Compounds:
An energy level difference between the singlet state and the triplet state of the thermally activated delayed fluorescent material can be completed by Guassian 09 software (Guassian Inc.), a specific simulation method of the energy level difference ΔEst can refer to J. Chem. Theory Comput., 2013, DOI: 10.1021/ct400415r; and the molecular structure optimization and excitation can be completed by the TD-DFT method "B3LYP" and the base group "6-31g(d)"; the thermally activated delayed fluorescent materials M1, M2, M3, M4, M6 and ref provided by the present disclosure were simulated according to the above methods, the results are as shown in Table 1.

Figure 2:
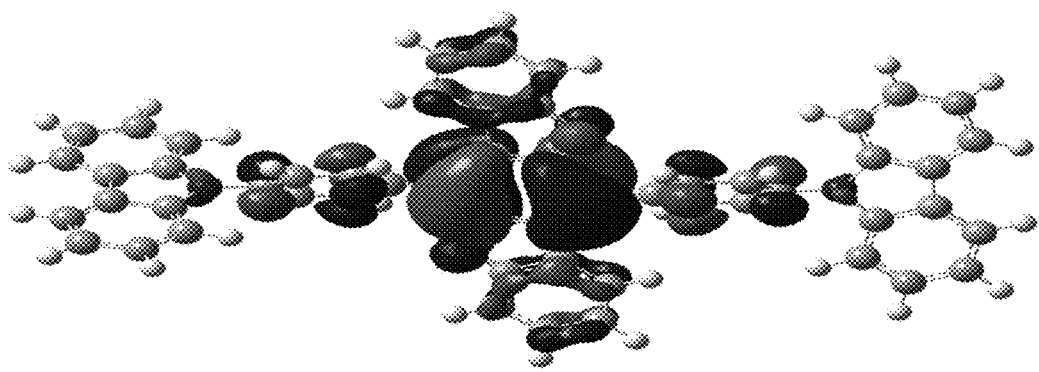
FIG. 2 is a LUMO orbital layout diagram of the thermally activated delayed fluorescent material M1 provided in Example 1 of the present disclosure.

(2) Simulation of Orbital Layout of Compounds:

The orbital layout diagram of the thermally activated delayed fluorescent material M1 provided by the present disclosure was simulated according to methods in the related technics, for example, referring to Furche F, Ahlrichs R. Adiabatic time-dependent density functional methods for excited state properties[J]. Journal of Chemical Physics, 2002, 117(16): 7433. The HOMO orbital layout diagram of M1 is as shown in FIG. 1, the LUMO orbital layout of M1 is as shown in FIG. 2. As can be seen from the comparison of FIG. 1 and FIG. 2, the HOMO and LUMO of M1 are arranged in different areas, respectively, which achieve a complete separation, help reduce the gap energy difference $\Delta E_{ST}$, and thus improving the ability of reverse intersystem crossing.

(3) Performance Evaluation of OLED Devices:

The current of the OLED device at different voltages was measured with a Keithley 2365A digital nanovoltmeter, and then the current density at different voltages of the OLED device was obtained by dividing the current by the light-emitting area; the OLED device was tested for luminance and radiant energy flux density at different voltages using a Konicaminolta CS-2000 spectroradiometer; According to the current density and luminance of the OLED device at different voltages, current efficiency (Cd/A) and external quantum efficiency (%) at the same current density (10 mA/cm$^2$) were obtained. The turn-on voltage ($V_{turn-on}$), the current efficiency ($CE_{max}$), the external quantum efficiency ($EQE_{max}$), the power efficiency ($hp_{max}$) and the chromaticity coordinates CIE (x, y) of the OLED device provided in application examples 1-5 and comparative example 1 were tested according to the above methods, and the results are as shown in Table 2.

TABLE 1

| Compounds | HOMO (eV) | LUMO (eV) | S$_1$ (eV) | T$_1$ (eV) | $\Delta E_{ST}$ (eV) | T |
|---|---|---|---|---|---|---|
| M1 | −5.41 | −3.05 | 2.24 | 2.15 | 0.09 | 5.65 μs |
| M2 | −5.48 | −3.16 | 2.11 | 2.03 | 0.08 | 9.71 μs |
| M3 | −5.39 | −2.98 | 2.19 | 2.09 | 0.10 | 7.32 μs |
| M4 | −5.58 | −3.18 | 2.35 | 2.23 | 0.12 | 8.27 μs |
| M6 | −5.73 | −3.31 | 2.29 | 2.21 | 0.08 | 3.76 μs |
| ref | −5.65 | −3.12 | 2.54 | 2.01 | 0.53 | 5.98 ns |

It can be seen from the data in Table 1 that the $\Delta E_{ST}$ of the thermally activated delayed fluorescent material provided by Examples 1-5 of the present disclosure can be reduced to below 0.25 eV, or even lower than 0.15 eV, achieving a smaller energy level difference between the singlet state and the triplet state, which is beneficial to reverse intersystem crossing. The fluorescence lifetime is greatly improved, and it can reach μs level, even 9.71 μs, having obvious delayed fluorescence effect. Compared with ref (N,N'-diarylquinacridone) in the comparative example, it is more suitable to be used as a light-emitting layer material of an organic electroluminescent device.

TABLE 2

| dopant material of the light-emitting layer | $V_{turn-on}$ (V) | $CE_{max}$ (cd/A) | $hp_{max}$ (lm/W) | $EQE_{max}$(%) | CIE(x, y) |
|---|---|---|---|---|---|
| M1 | 2.6 | 39.8 | 47.5 | 12.39 | (0.17, 0.73) |
| M2 | 2.7 | 20.1 | 23.3 | 10.25 | (0.19, 0.63) |
| M3 | 2.4 | 25.6 | 32.9 | 10.72 | (0.15, 0.81) |
| M4 | 2.5 | 19.9 | 24.2 | 11.63 | (0.16, 0.79) |
| M6 | 2.8 | 28.3 | 31.7 | 15.29 | (0.15, 0.69) |
| ref | 2.9 | 19.7 | 21.3 | 9.85 | (0.18, 0.72) |

As can be seen from the data in Table 2, the OLED device prepared based on the thermally activated delayed fluorescent material provided in Examples 1-5 of the present disclosure as a light-emitting layer material has a lower turn-on voltage (as low as 2.4 V), a higher current efficiency (up to 19.9 Cd/A or more, even up to 39.8 Cd/A), power efficiency (up to 23-48 lm/W) and external quantum efficiency (even up to 15.29%). This is mainly due to the fact that the thermally activated delayed fluorescent material provided by the present disclosure has a high triplet energy and a small energy level difference $\Delta E_{ST}$. The material designed by the present disclosure is applied in an evaporation process, the efficiency is obviously improved, the voltage reduction effect is obvious, and the power consumption of the device is effectively reduced, and it is suitable to be used as a light-emitting layer material of the organic electroluminescent device.

Applicant has stated that although the thermally activated delayed fluorescent material and application thereof provided by the present disclosure have been described by the above Examples, the present disclosure is not limited to the above processing steps, that is to say, it is not meant that the present disclosure has to be implemented depending on the above processing steps. It will be apparent to those skilled in the art that any improvements made to the present disclosure, equivalent replacements and addition of adjuvant ingredients to the raw materials selected in the present disclosure, and selections of the specific implementations, etc., all fall within the protection scope and the disclosure scope of the present disclosure.

What is claimed is:

1. A thermally activated delayed fluorescent material, wherein the thermally activated delayed fluorescent material is a compound comprising a structure represented by Formula I, wherein the compound comprising a structure represented by Formula I is selected from. a compound comprising a structure represented by Formula III, Formula IV or Formula V:

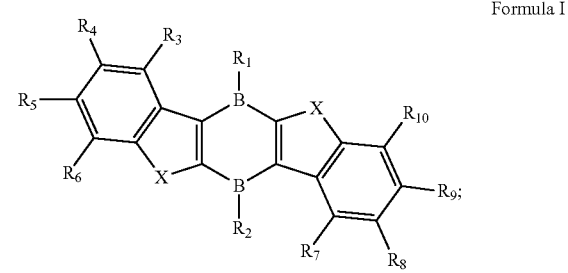

Formula I

-continued

Formula III

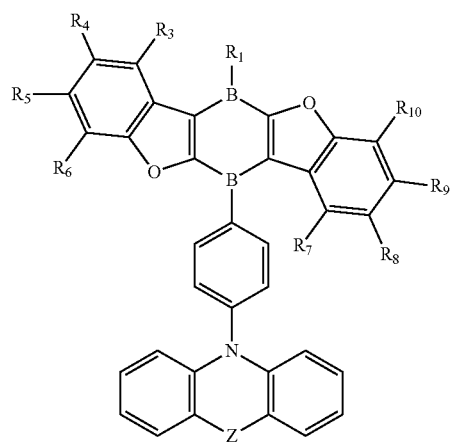

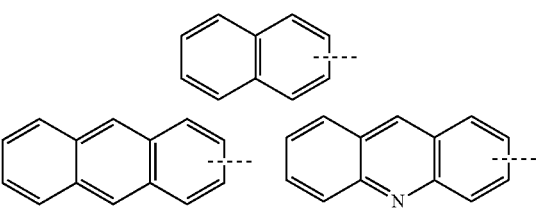

Formula IV

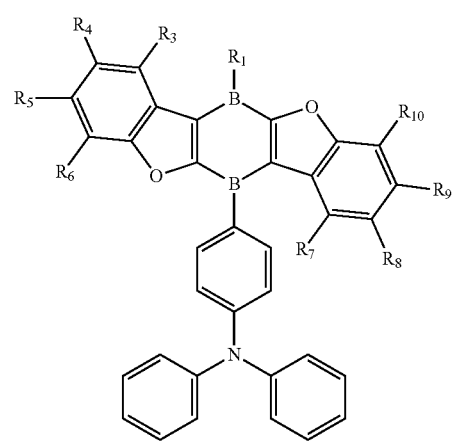

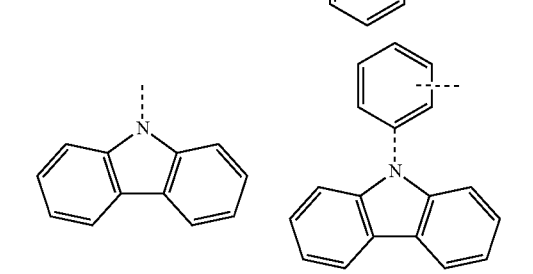

Formula V

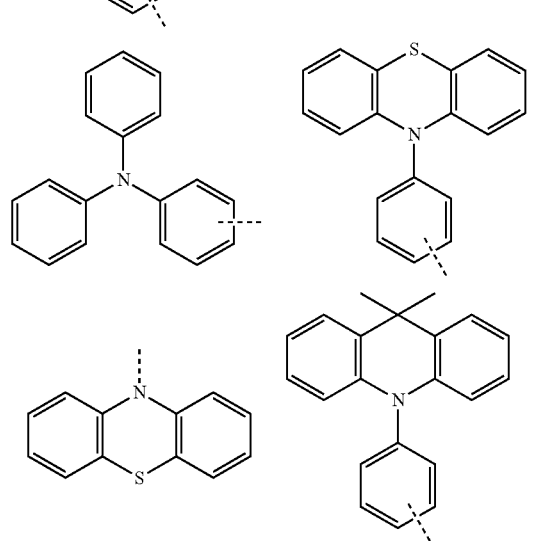

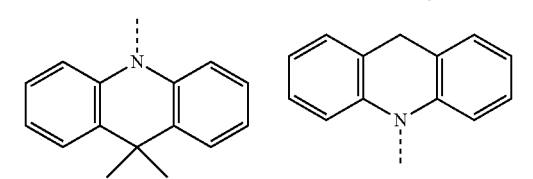

wherein Z is S, O, N-Rv or Rs-C-Rt; Rv, Rs and Rt each is independently selected from any one of a group consisting of hydrogen, fluorine, chlorine, a C1-C10 linear or branched alkyl group, a C6-C20 aryl group, and a C3-C20 heteroaryl group;

wherein R1 is selected from any one of a group consisting of the following groups and the following groups substituted by a substituent:

-continued

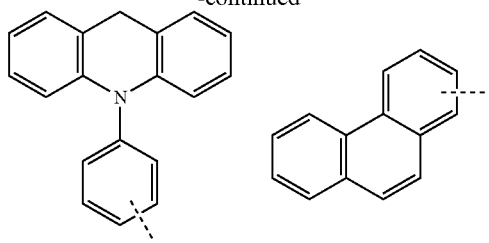
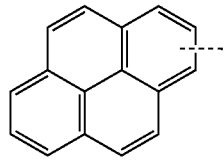
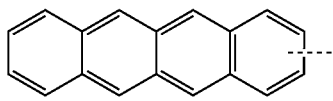
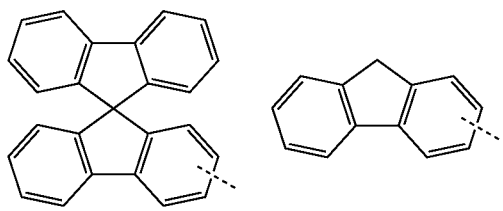
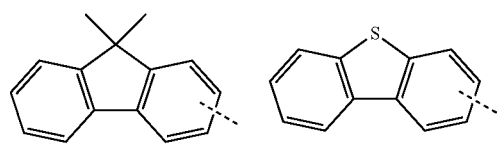
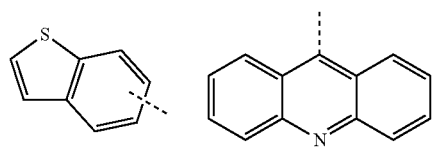
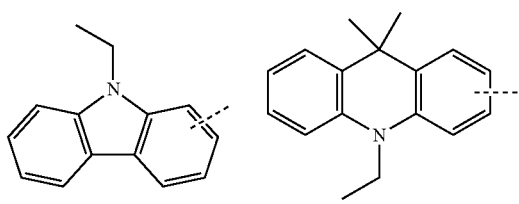
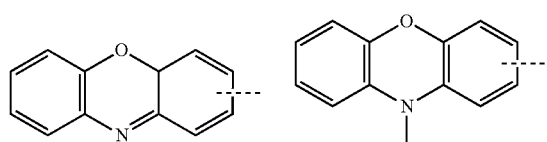
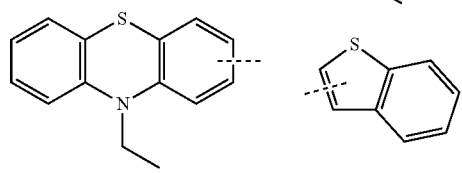

-continued

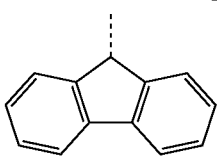
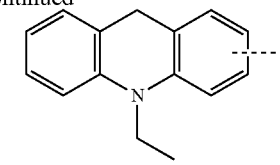

wherein a dotted line represents a linkage site;

wherein $R_3$-$R_{10}$ each is independently selected from any one of a group consisting of hydrogen, fluorine, chlorine, a. substituted or unsubstituted C1-C30 alkyl group, a substituted or unsubstituted C3-C30 cycloalkyl group, a substituted or unsubstituted C3-C20 heterocycloalkyl group, a substituted or unsubstituted C6-C60 aryl group, and a substituted or unsubstituted C3-C60 heteroaryl group; $R_3$-$R_{10}$ are not linked to each other or at least two of them adjacent to each other are linked to form a ring or fused with each other; and wherein when a substituent exists in the above groups, the substituent is selected from at least one of a group consisting of fluorine, chlorine, a C1-C10 linear or branched alkyl group, a C6-C20 aryl group, a C1-C10 alkoxyl group, a C6-C20 arylamino group, and a C3-C20 cycloalkyl group.

2. The thermally activated delayed fluorescent material according to claim 1, wherein $R_1$ and $R_2$ are the same.

3. The thermally activated delayed fluorescent material according to claim 1, wherein $R_3$-$R_{10}$ each is independently selected from any one of a group consisting of hydrogen, fluorine, chlorine, a substituted or unsubstituted C1-C10 linear or branched alkyl group, a substituted or unsubstituted C6-C12 aryl group, and a substituted or unsubstituted C3-C12 heteroaiyl group; and when a substituent exists in the above groups, the substituent is selected from. at least one of a group consisting of fluorine, chlorine, a C1-C10 alkoxyl group, a hydroxyl group, a carboxyl group, a C1-C10 linear or branched alkyl. group, and a C6-C20 arylamino group.

4. The thermally activated delayed. fluorescent material according to claim 1, wherein $R_3$-$R_{10}$ are all hydrogen.

5. The thermally activated delayed fluorescent material according to claim 1, wherein any two adjacent groups among $R_3$-$R_{10}$ are linked to form a ring or fused with each other.

6. The thermally activated delayed fluorescent material according to claim 1, wherein the thermally activated delayed fluorescent material has an energy level difference between the lowest singlet state $S_1$ and the lowest triplet state $T_1$ of $\Delta E_t = E_{S1} - E_{T1} \leq 0.25$ eV.

7. The thermally activated delayed fluorescent material according to claim I, wherein the thermally activated delayed fluorescent material comprises any one or a combination of at least two of the following compounds:

M1
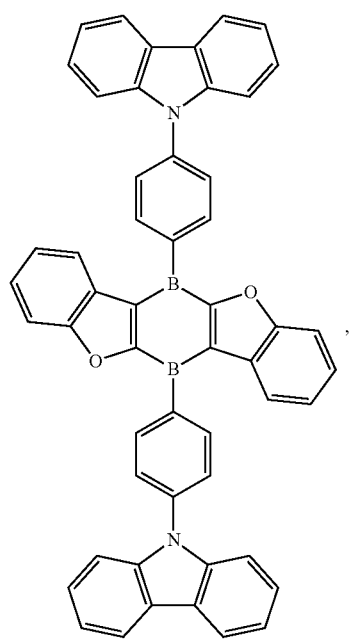
M3
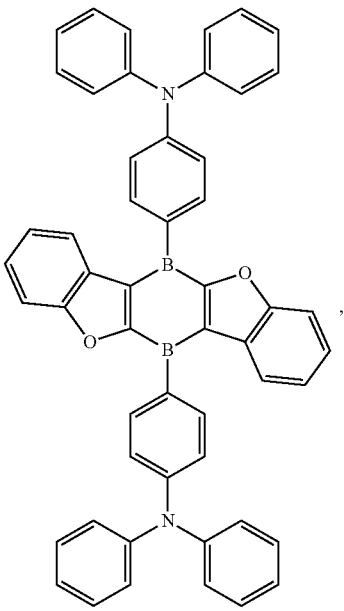
M2
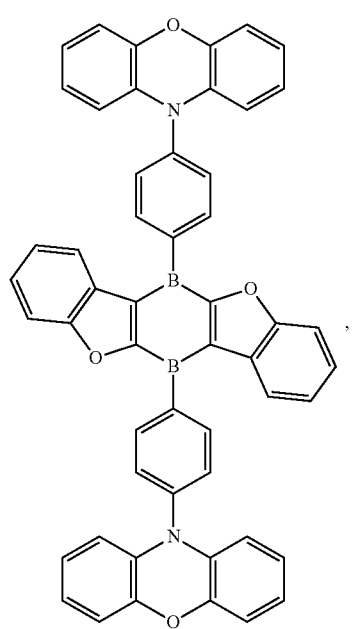
M4
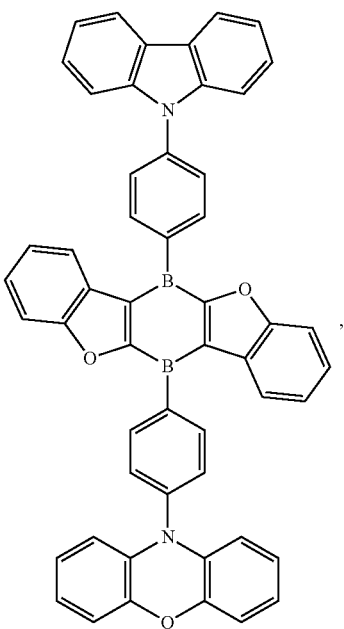

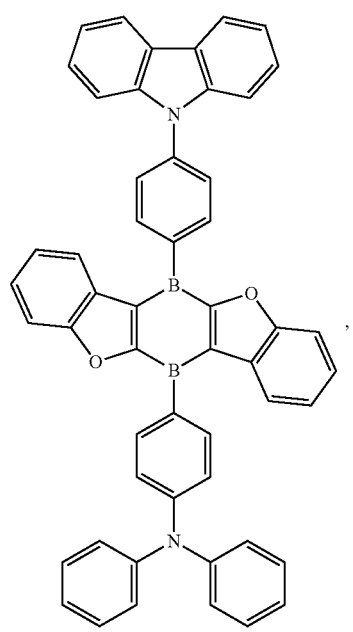
M5
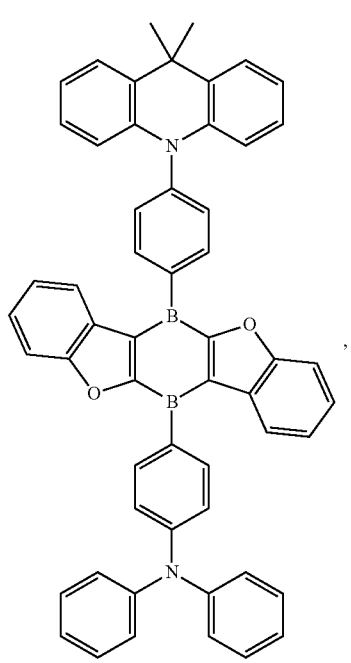
M7
M6
M8

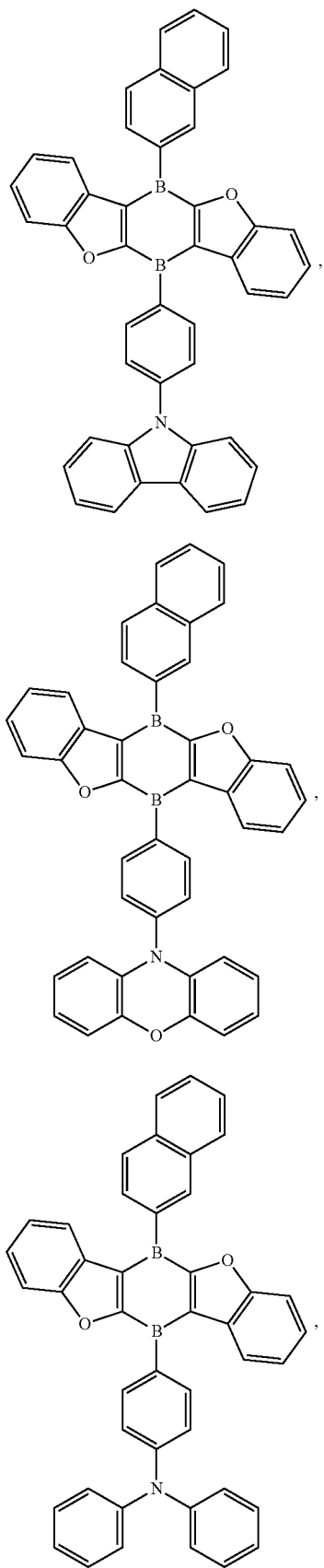

-continued
M14
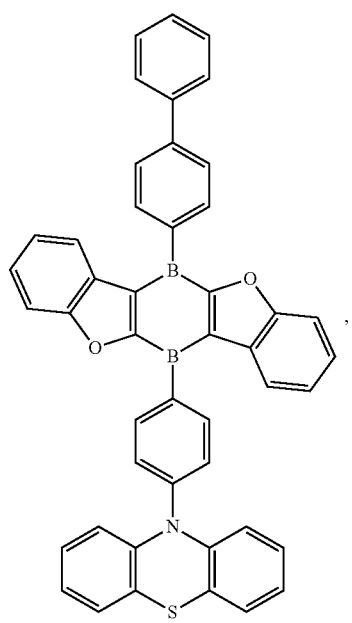
M15
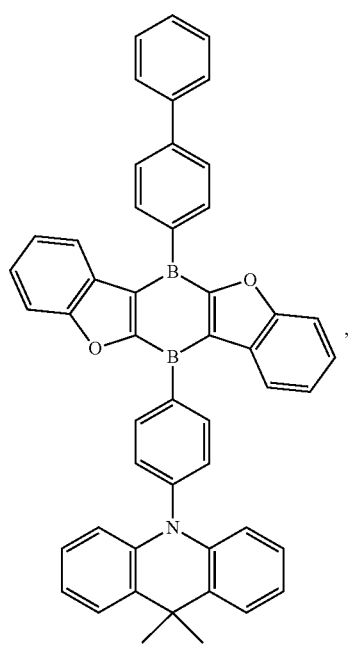
-continued
M16
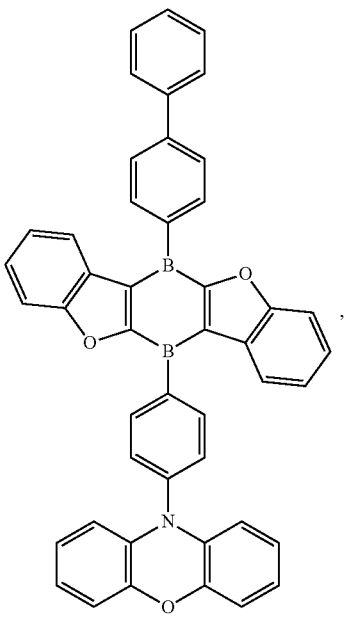
M18
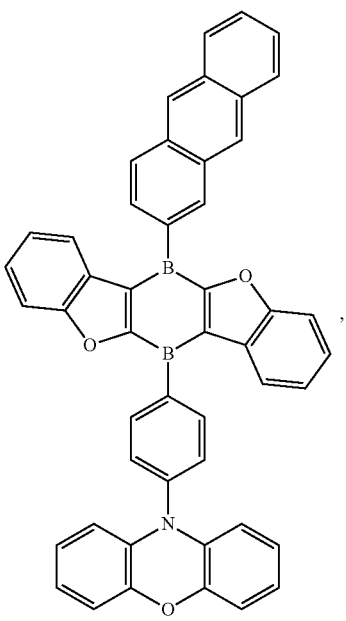

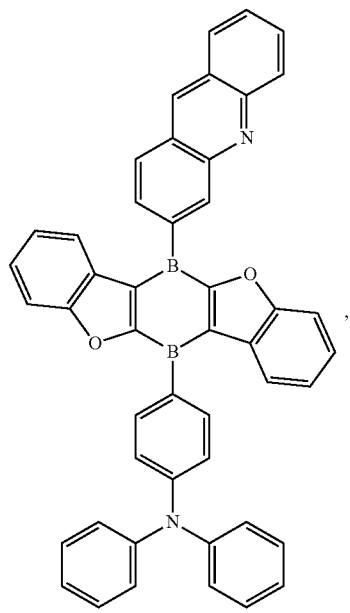
M19
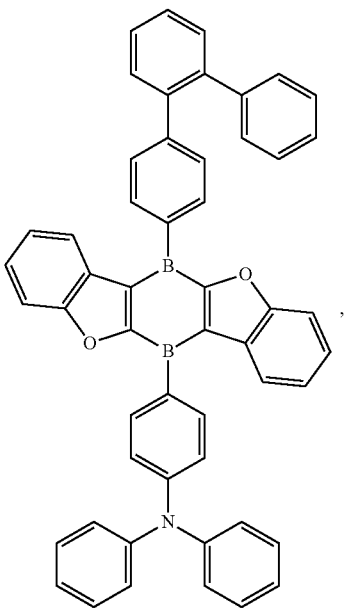
M21
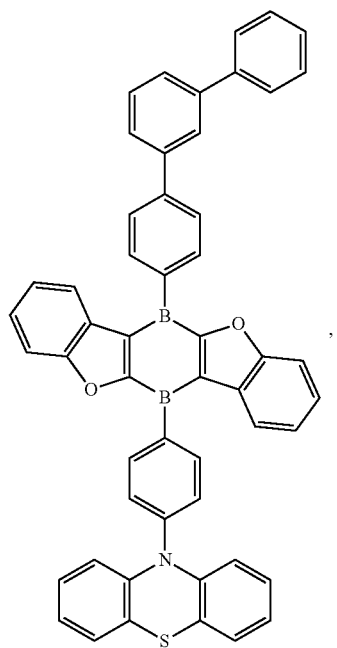
M20
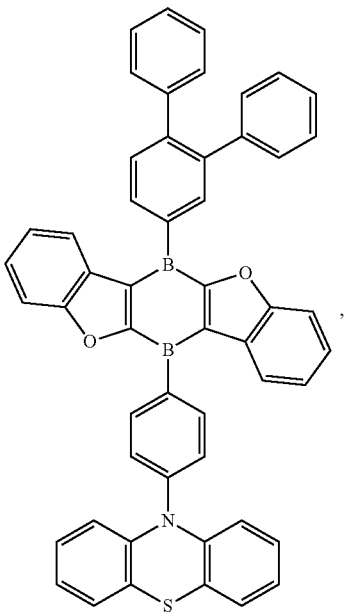
M22

M23
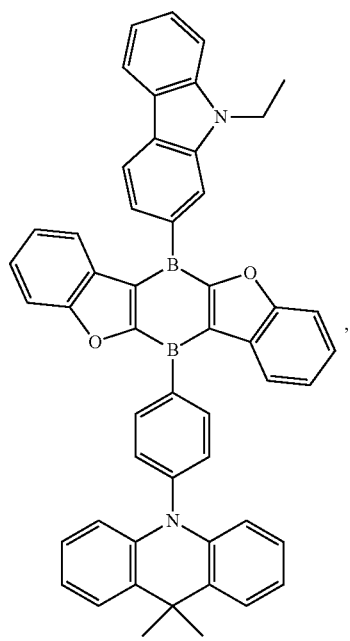
M24
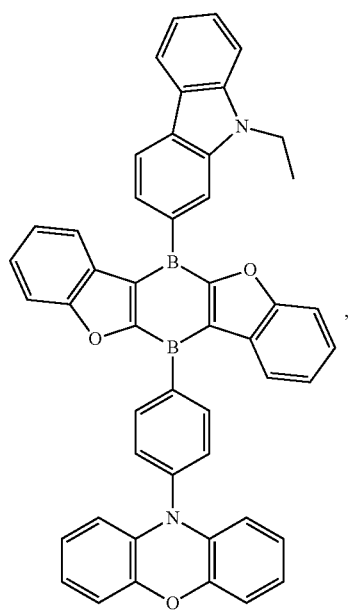
M25
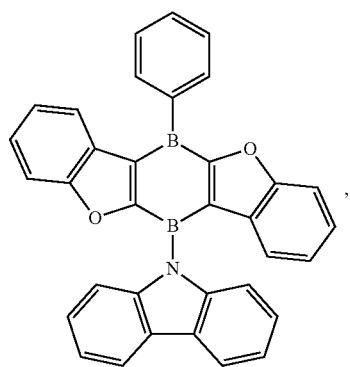
M26
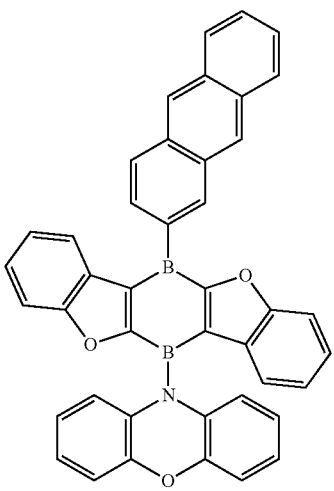
M27
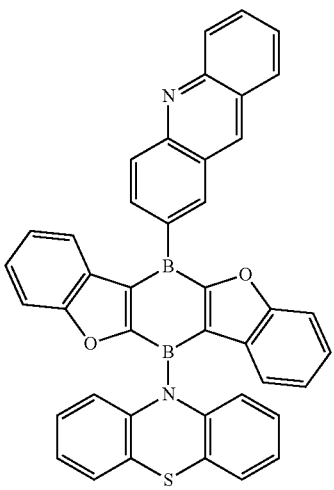
M28
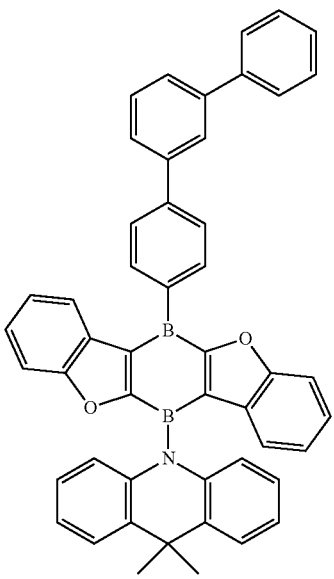

M30
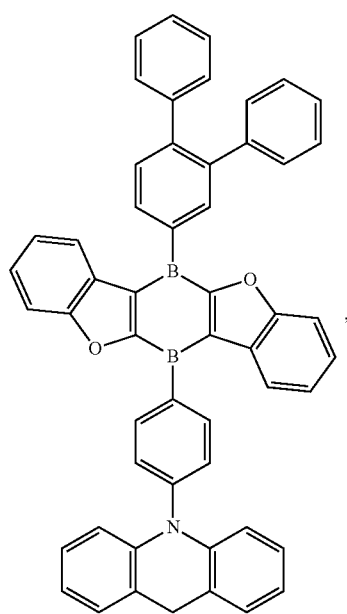
M31
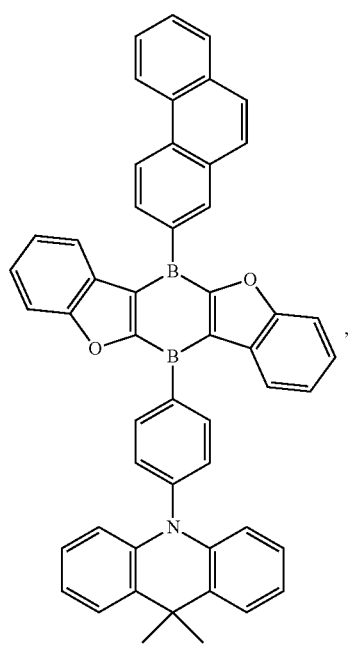
M32
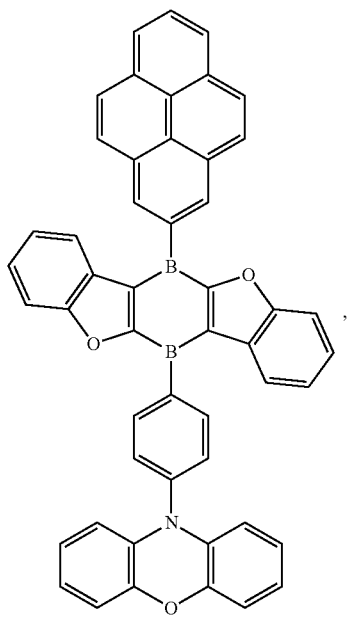
M33
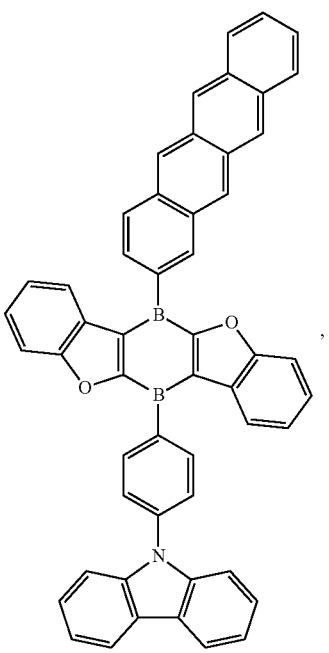

M34
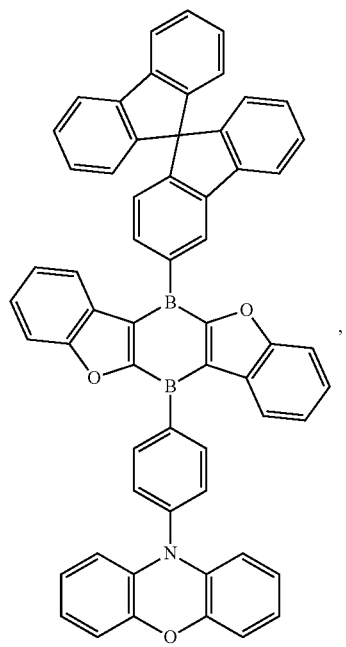
M35
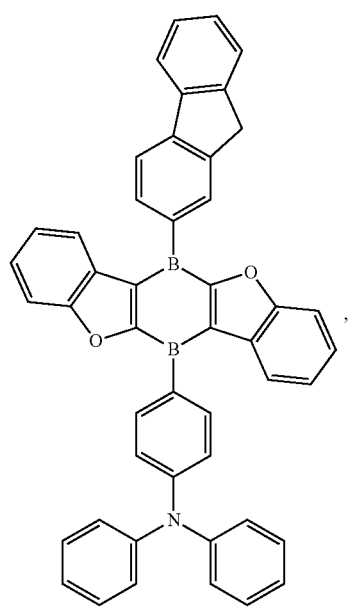
M36
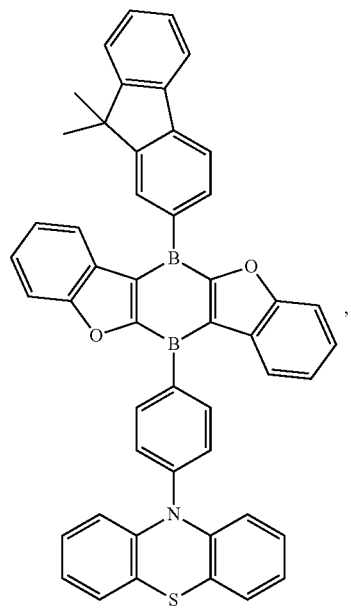
M37
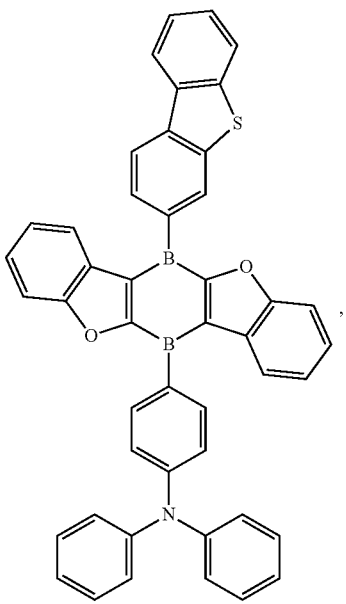

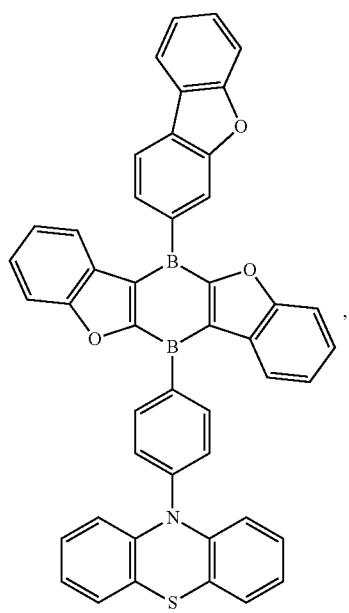
M38
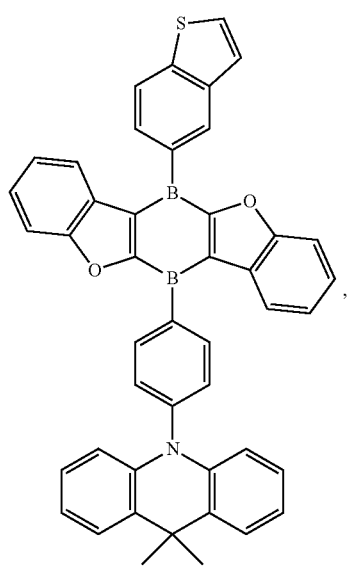
M39
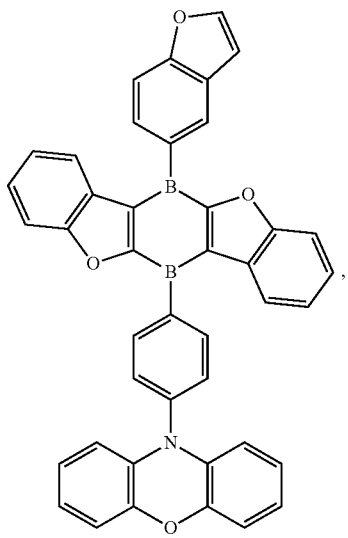
M40
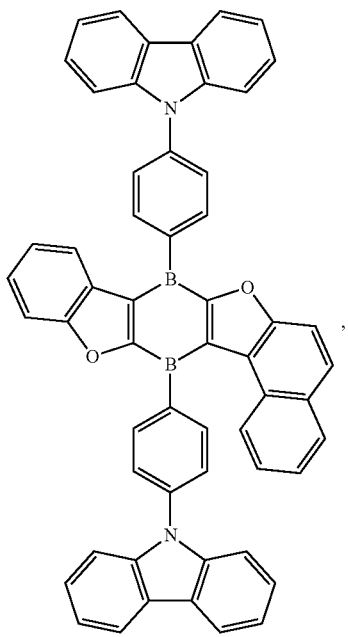
M41

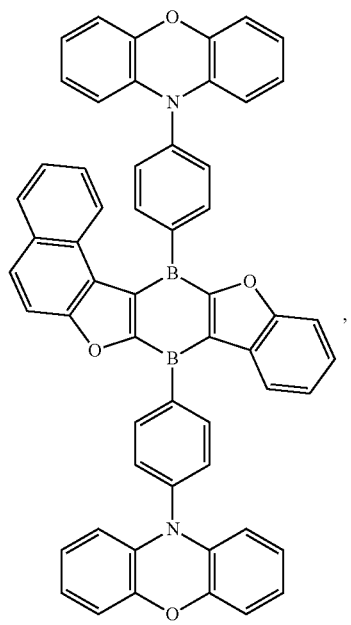
M42
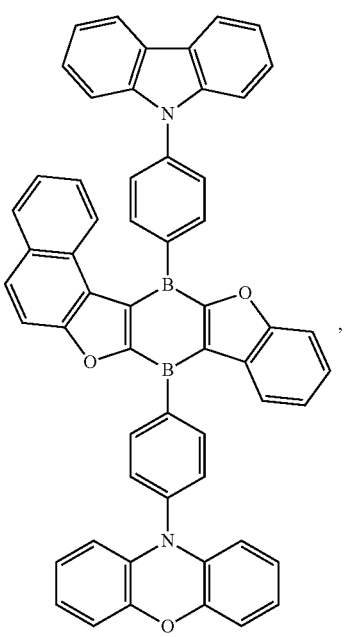
M44
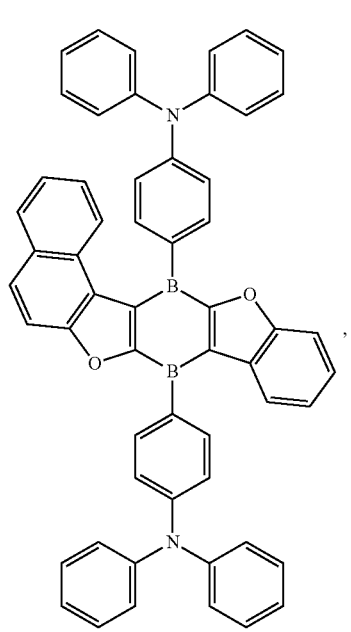
M43
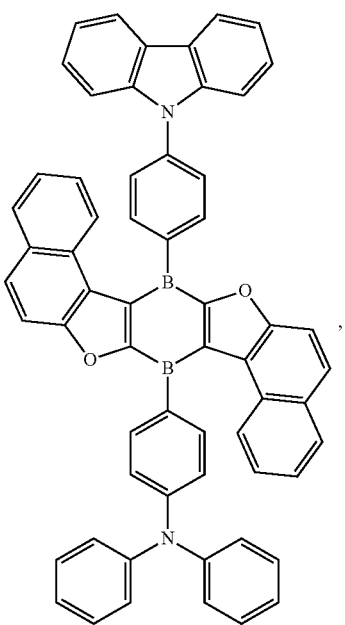
M45

M46
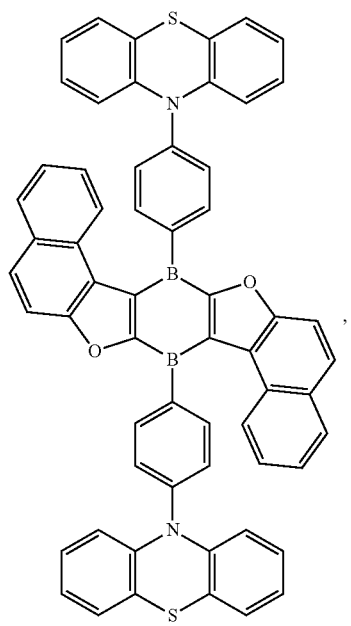
M48
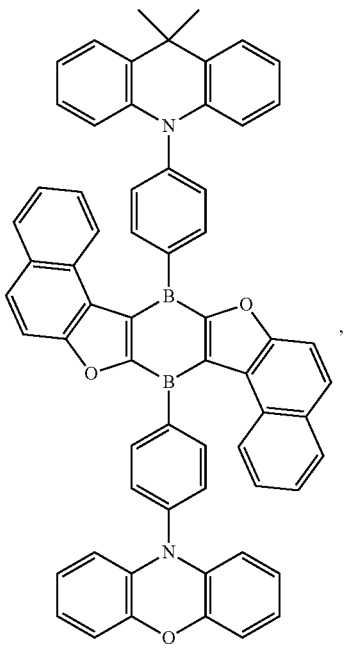
M47
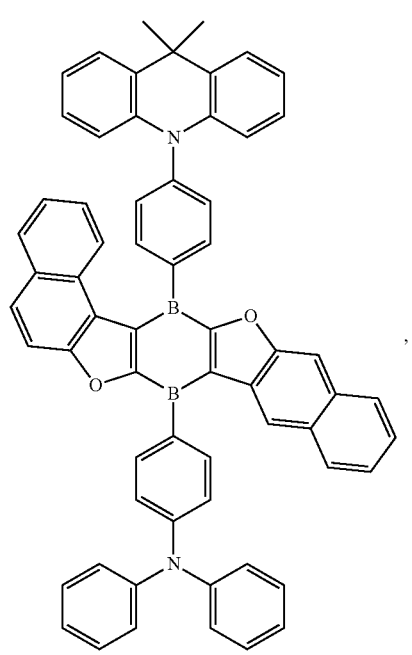
M49
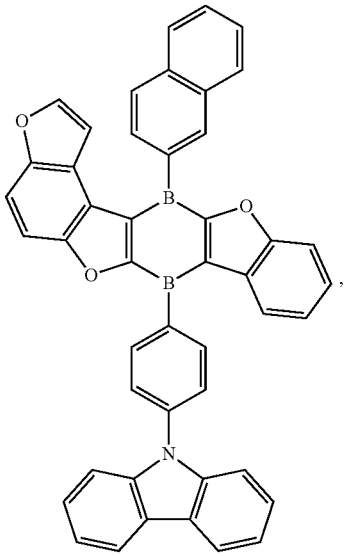

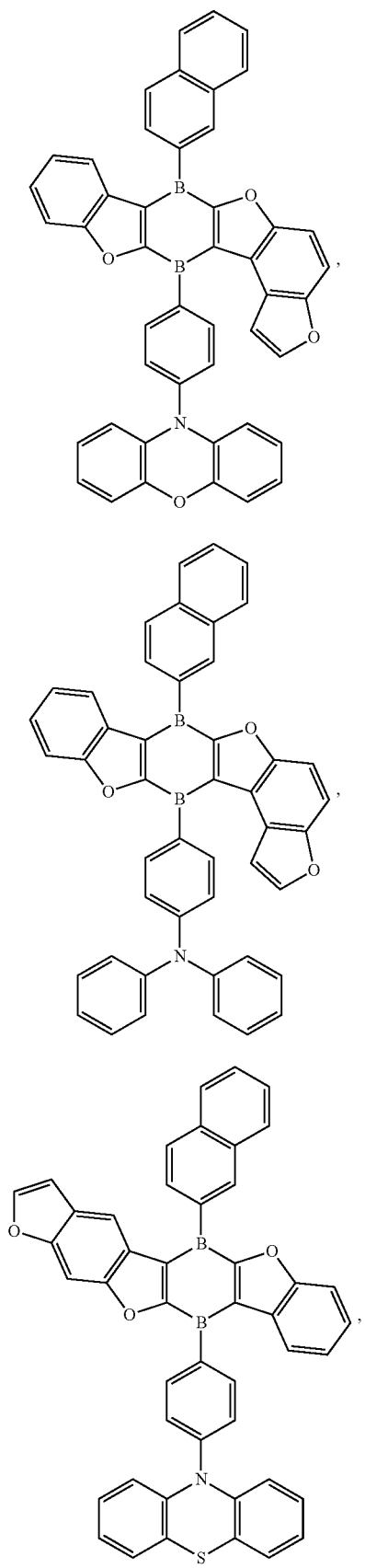
M50
M51
M52
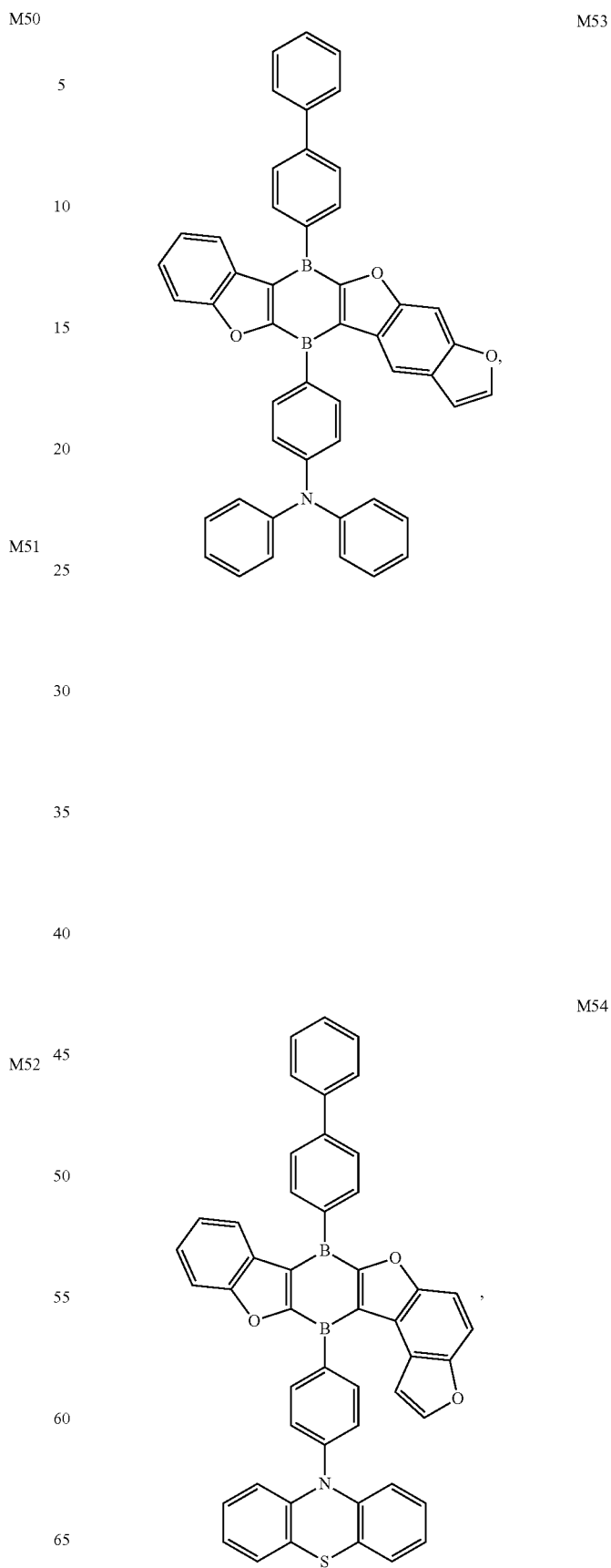
M53
M54

M55
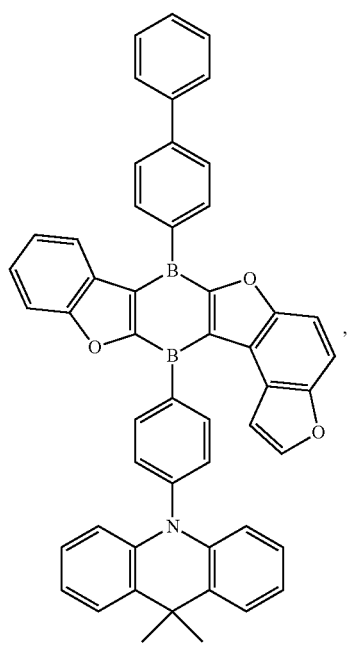
M58
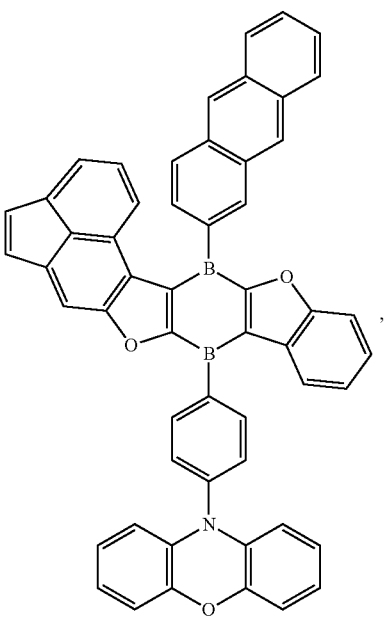
M56
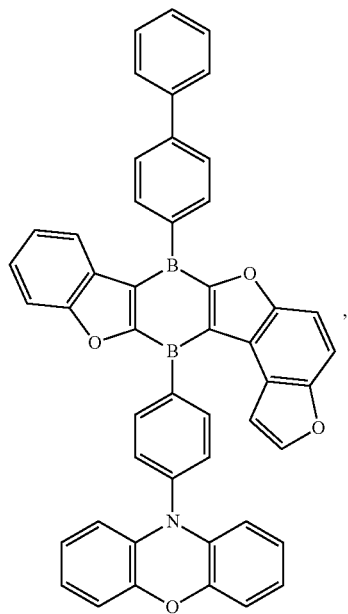
M59
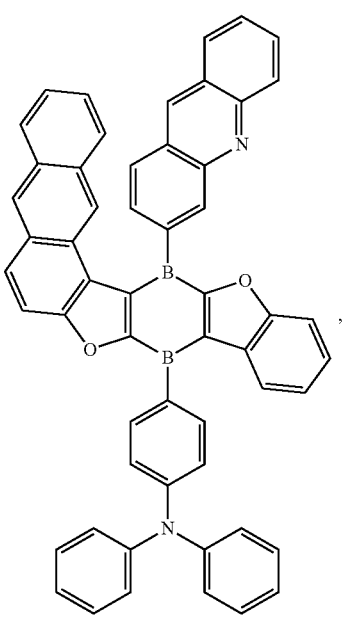

M60
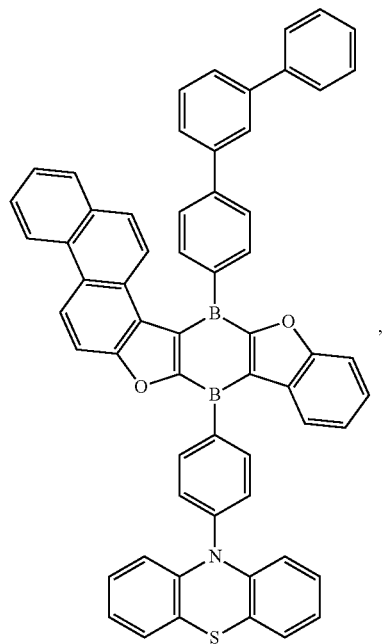
M61
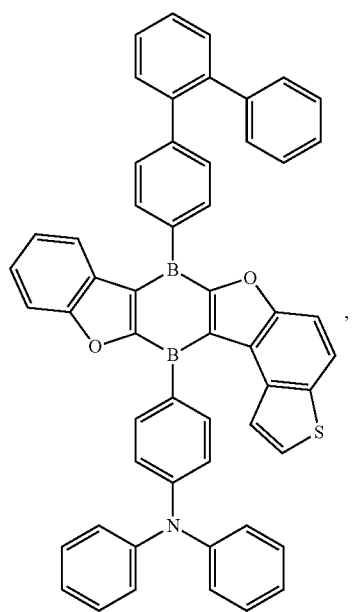
M62
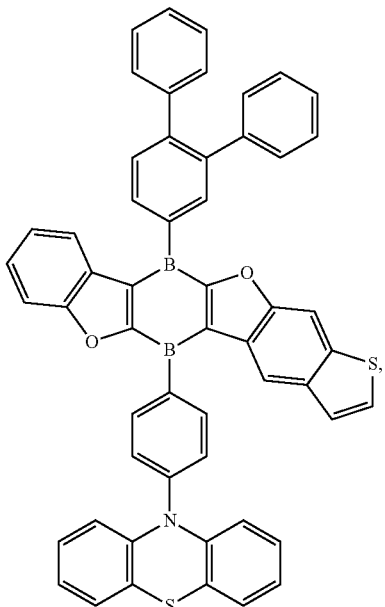
M63
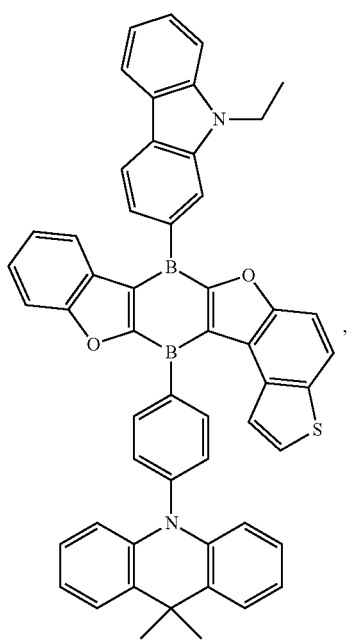

-continued
M64
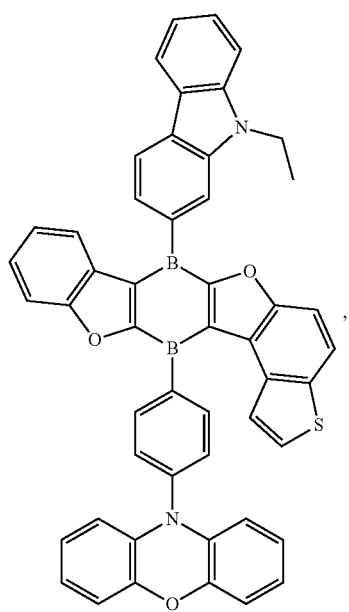
M65
M66
-continued
M67
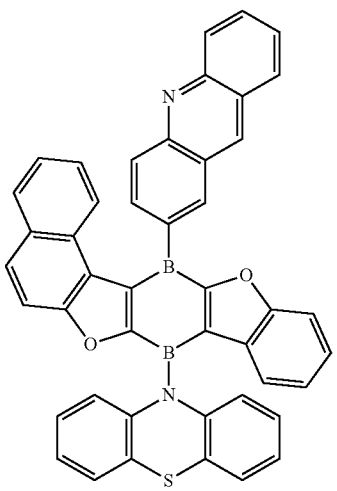
M68
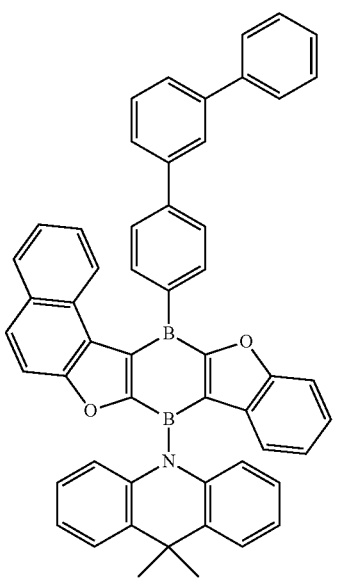
M70
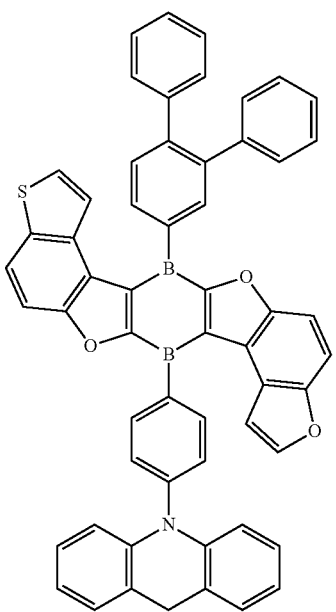

M71
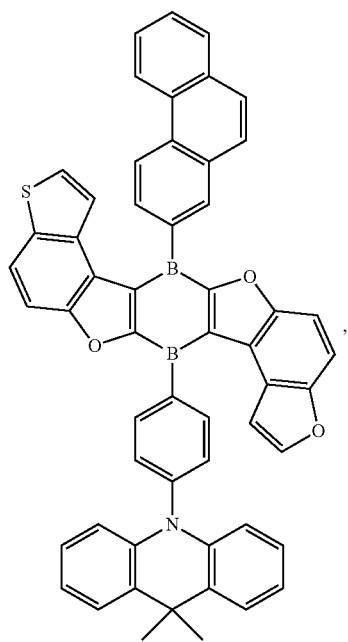
M73
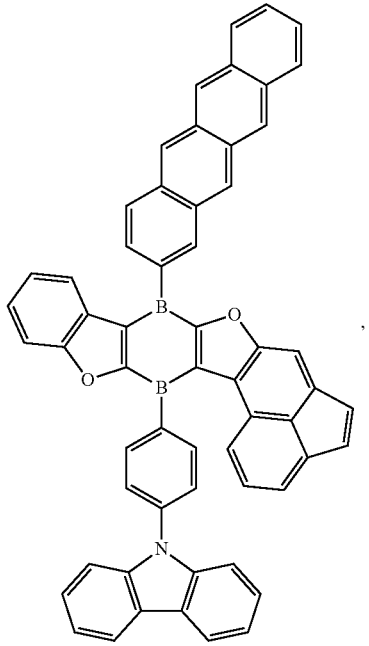
M72
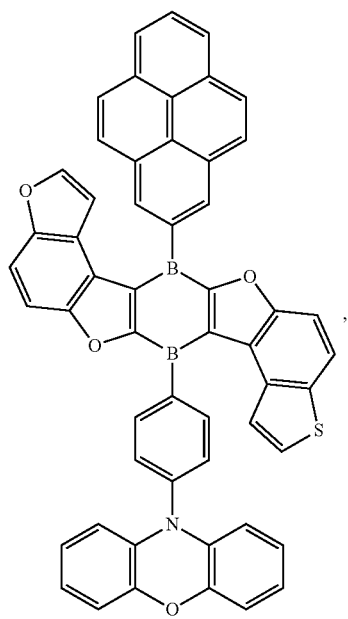
M74
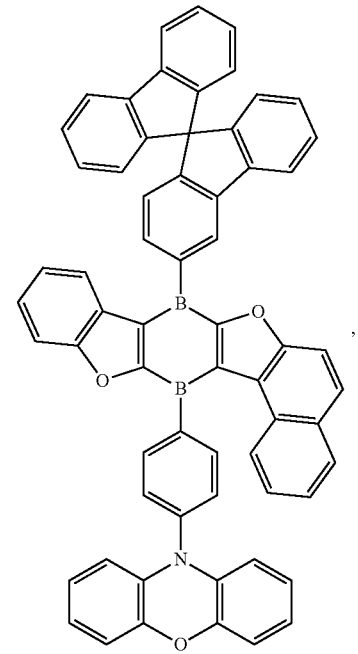

-continued

M75

M76

M77

M78

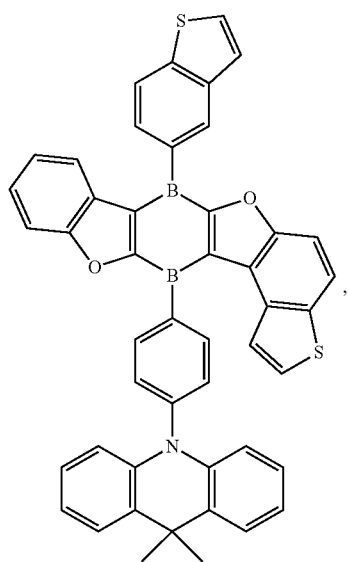
M79
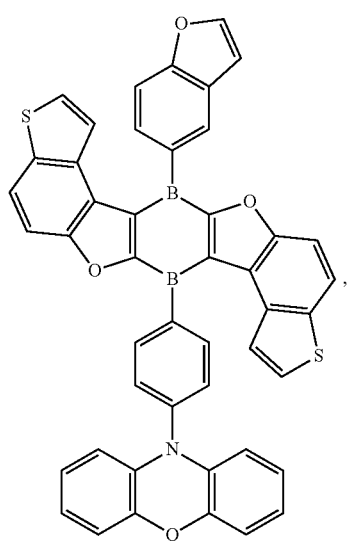
M80
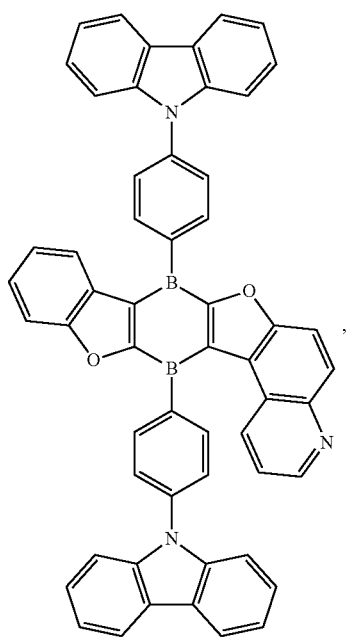
M81
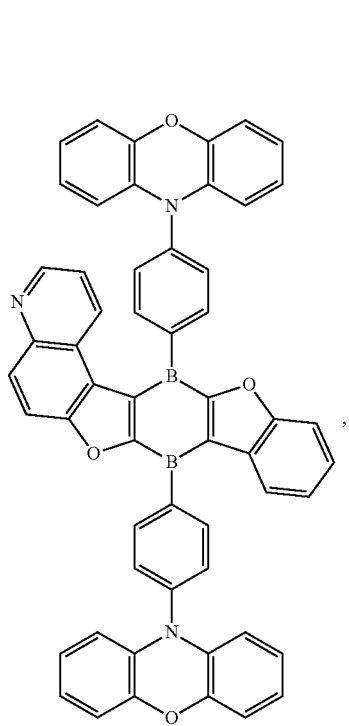
M82

M83
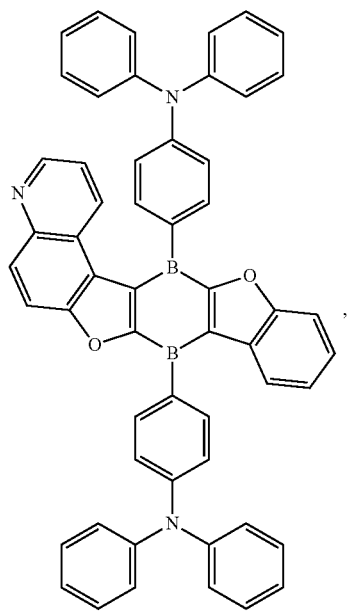
M84
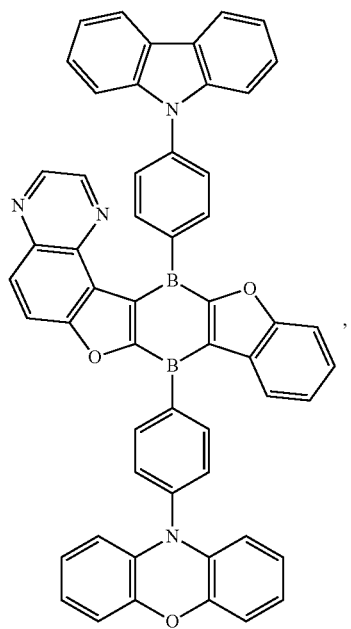
M85
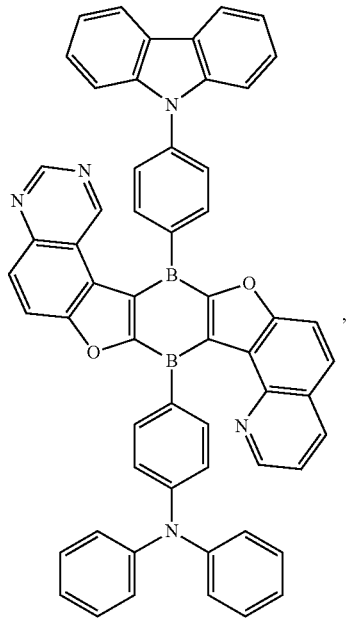
M86
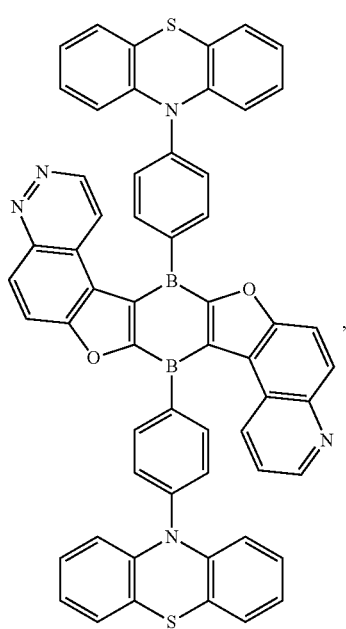

M87 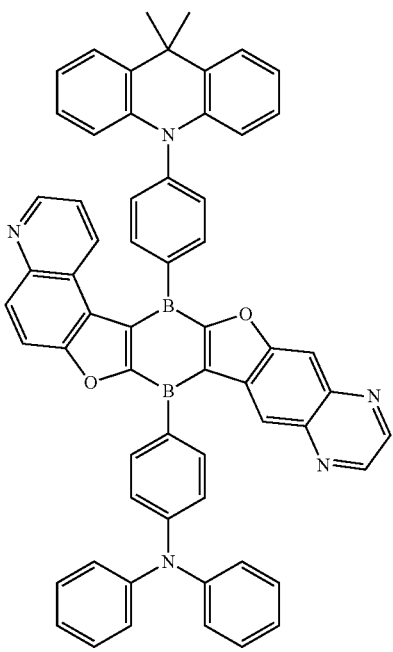

8. A display panel comprising an OLED device, the OLED device comprises an anode, a cathode, and at least one organic thin film layer between the anode and the cathode, the organic thin film layer comprises a light-emitting layer, and any one or a combination of at least two of a hole transport layer, a hole injection layer, an electron blocking layer, a hole blocking layer, an electron transport layer, and an electron injection layer;

the light-emitting layer comprises the thermally activated delayed fluorescent material according to any one of claims 1 and 2 to 7, and the thermally activated delayed fluorescent material is used as any one of a guest material, a host material and a co-doped material.

9. The display panel according to claim 8, wherein the light-emitting layer comprises a host material and a guest material, and the guest material according to any one of claims 1 and 2 to 7.

10. An electronic device, wherein it comprises the display panel according to claim 8.

* * * * *